United States Patent
Mersch et al.

(10) Patent No.: US 12,332,623 B2
(45) Date of Patent: Jun. 17, 2025

(54) METHOD FOR MODIFYING A CONTROL SOFTWARE OF AN AUTOMATION SYSTEM

(71) Applicant: Beckhoff Automation GmbH, Verl (DE)

(72) Inventors: Henning Mersch, Verl (DE); Birger Evenburg, Selmsdorf (DE)

(73) Assignee: Beckhoff Automation GmbH, Verl (DE)

(*) Notice: Subject to any disclaimer, the term of this patent is extended or adjusted under 35 U.S.C. 154(b) by 578 days.

(21) Appl. No.: 17/411,762

(22) Filed: Aug. 25, 2021

(65) Prior Publication Data

US 2021/0382453 A1    Dec. 9, 2021

Related U.S. Application Data

(63) Continuation of application No. PCT/EP2020/060742, filed on Apr. 16, 2020.

(30) Foreign Application Priority Data

Apr. 26, 2019    (DE) .................... 10 2019 110 884.5

(51) Int. Cl.
G05B 19/042    (2006.01)
(52) U.S. Cl.
CPC ............... *G05B 19/0426* (2013.01); *G05B 2219/21092* (2013.01); *G05B 2219/23008* (2013.01)
(58) Field of Classification Search
None
See application file for complete search history.

(56) References Cited

U.S. PATENT DOCUMENTS 6,898,768 B1    5/2005  Theodossy et al.
9,003,387 B2 *  4/2015  Van Camp ............... G06F 8/65
                                              717/170

(Continued)

FOREIGN PATENT DOCUMENTS

DE    102008016048 A1 * 10/2009  ......... G05B 19/0423
DE    102014105207 A1 * 10/2015  ......... H04L 12/1854

(Continued)

OTHER PUBLICATIONS

Hagen CJ, Brouwers G. Reducing software life-cycle costs by developing configurable software. In Proceedings of National Aerospace and Electronics Conference (NAECON'94) May 23, 1994 (pp. 1182-1187). IEEE. (Year: 1994).*

(Continued)

*Primary Examiner* — Uyen T Le
(74) *Attorney, Agent, or Firm* — Dorsey & Whitney LLP

(57) ABSTRACT

A method for modifying control software of an automation system having a controller and a plurality of subscribers, where the subscribers are connected to the controller via a data bus and communicate via a data exchange, at least one subscriber is a software subscriber for modifying control software of the controller, and the software subscriber comprises a memory unit on which at least one modification instruction for modifying the control software is stored. The controller sends an individual query message to the software subscriber for querying the modification instruction, the software subscriber sends a response to the controller providing the modification instruction, and the controller verifies whether the modification instruction is compatible with the control software, modifying the control software according if the modification instruction is compatible with the control software, and discarding the modification instruction if not compatible with the control software.

13 Claims, 9 Drawing Sheets

(56) References Cited

U.S. PATENT DOCUMENTS

| | | | |
|---|---|---|---|
| 10,872,187 B2 * | 12/2020 | Platzer | G06F 30/3323 |
| 11,113,366 B2 | 9/2021 | Dasgupta et al. | |
| 2003/0061276 A1 | 3/2003 | Mirho | |
| 2003/0074235 A1 | 4/2003 | Gregory | |
| 2007/0160022 A1 * | 7/2007 | McCoy | H04L 67/12 370/338 |
| 2008/0189636 A1 * | 8/2008 | Hood | H04L 12/40 715/764 |
| 2008/0301270 A1 | 12/2008 | John | |
| 2009/0086790 A1 * | 4/2009 | Sosedov | G06F 1/20 374/43 |
| 2010/0070965 A1 | 3/2010 | Britten et al. | |
| 2010/0162231 A1 | 6/2010 | Navarro et al. | |
| 2010/0169876 A1 | 7/2010 | Mann | |
| 2015/0253748 A1 * | 9/2015 | Brun | H04L 12/2818 700/275 |
| 2017/0048076 A1 * | 2/2017 | Li | H04L 41/0816 |
| 2018/0349576 A1 | 12/2018 | Dasgupta et al. | |

FOREIGN PATENT DOCUMENTS

| | | | | |
|---|---|---|---|---|
| DE | 102015121091 A1 | | 6/2016 | |
| DE | 102016106807 A1 * | | 10/2016 | B23Q 16/001 |
| DE | 102015117937 B3 * | | 1/2017 | H04L 12/40176 |
| DE | 102017127766 B3 | | 10/2018 | |
| DE | 102019110884 A1 | | 10/2020 | |
| EP | 1852758 A2 | | 11/2007 | |
| EP | 2073451 A1 * | | 6/2009 | H04L 12/40006 |
| EP | 2421344 A2 | | 2/2012 | |
| EP | 2796951 A1 * | | 10/2014 | G05B 19/0426 |
| ES | 2593831 T3 * | | 12/2016 | G05B 9/02 |
| IN | 422401 | | 2/2023 | |
| KR | 20130128665 A | | 11/2013 | |
| WO | WO-2014032720 A1 * | | 3/2014 | G05B 19/0426 |
| WO | 2020216674 A1 | | 10/2020 | |

OTHER PUBLICATIONS

Wheater, S. M., & Little, M. C. (May 1996). The design and implementation of a framework for configurable software. In Proceedings of International Conference on Configurable Distributed Systems (pp. 136-143). IEEE. (Year: 1996).*

Scheibelmasser A, Traussnigg U, Schindin G, Derado I. Device Integration into automation systems with Configurable Device Handler. InInformatics in Control, Automation and Robotics I. 2006 (pp. 53-60). Springer Netherlands. (Year: 2006).*

"EtherCAT—the Ethernet Fieldbus," EtherCAT Technology Group, Nov. 2012, 21 pages.

International Search Report and Written Opinion dated Jun. 9, 2020 in connection with International Patent Application No. PCT/EP2020/060742, 32 pages.

International Preliminary Report on Patentability dated Apr. 26, 2019, 36 pages including English translation.

First Office Action dated Nov. 8, 2023 in connection with Chinese patent application No. 202080029935.6, 8 pages including English translation.

* cited by examiner

METHOD FOR MODIFYING A CONTROL SOFTWARE OF AN AUTOMATION SYSTEM

CROSS-REFERENCE TO RELATED APPLICATIONS

This patent application is a continuation of International Patent Application No. PCT/EP2020/060742, filed Apr. 16, 2020, entitled METHOD FOR CHANGING CONTROL SOFTWARE OF AN AUTOMATION SYSTEM, which claims the priority of German patent application DE 10 2019 110 884.5, filed Apr. 26, 2019, entitled VERFAHREN ZUR ÄNDERUNG EINER STEUERUNGSSOFTWARE EINES AUTOMATISIERUNGSSYSTEMS, each of which is incorporated by reference herein, in the entirety and for all purposes.

FIELD

The present application provides a method for modifying control software of an automation system. The application further provides an automation system, which is configured to carry out the method. The application further provides a subscriber of such an automation system.

BACKGROUND

Modern automation systems have a high degree of complexity and require highly sophisticated control software.

For the data transmission of such complex automation systems, in which a large number of system subscribers may be controlled simultaneously by a controller and large amounts of data have to be transmitted, field-bus systems have become established. The advantage of such field-bus systems is a simplified wiring of the individual system subscribers and at the same time an almost interference-free communication of the respective subscribers. In return, however, the control software of such automation systems is highly complex, so that trained specialists are usually required to install or modify the systems.

In order to be able to make changes to the control software of an automation system, a high level of programming is usually required for this purpose. Usually, the corresponding automation systems, or at least parts of the automation systems, must be switched off for this purpose and appropriately trained personnel must be employed to program the change in the control software. Both are expensive and time-consuming, since the automation system is at a standstill while the control software is being programmed.

Alternatively, it is possible to integrate the automation system software with an additional controller. However, this is time-consuming and cost-intensive due to the required controller-controller synchronization and also requires trained specialist personnel.

Document EP 2 421 344 A2 discloses input/output devices having reconfigurable functionality. Document US 2008/301270 A1 discloses a system and a method for providing and installing device-specific functionalities, in particular field devices. Document EP 1 852 758 A2 discloses a system and method for providing flexible and distributed processing in an industrial control environment.

SUMMARY

An efficient method for modifying a control software of an automation system, a corresponding automation system configured to perform such a method and a subscriber of such an automation system are provided.

EXAMPLES

A method for modifying a control software of an automation system is provided, wherein the automation system comprises a controller and a plurality of subscribers, wherein the subscribers are connected to the controller via a data bus and communicate via data exchange, wherein at least one subscriber is a software subscriber for modifying the control software, and wherein the software subscriber comprises a memory unit on which at least one modification instruction for modifying the control software is stored, comprising: the controller sending an individual query message to the software subscriber for querying the at least one modification instruction for modifying the control software in a first query step, the software subscriber sending a response message to the controller for providing the at least one modification instruction for modifying the control software in a first response step, the controller verifying the at least one modification instruction for modifying the control software as to whether the modification instruction is compatible with the control software in a verification step, modifying the control software according to the modification instruction by the controller in a modification step if the modification instruction is compatible with the control software, and discarding of the modification instruction by the controller in a discarding step if the modification instruction is not compatible with the control software.

This achieves the technical advantage of providing an efficient method for modifying a control software of an automation system.

Via the software subscriber, which is preferably embodied as a separate component, particularly preferably as a terminal, or a bus terminal, a simplified modification of the control software of an automation system may be achieved without the need for complex programming by trained specialist personnel.

The software subscriber functions in the automation system as an independent subscriber that may communicate with the controller via a data exchange. The software subscriber has a memory unit on which a modification instruction for modifying the control software of the controller is stored. Optionally, a plurality of different modification instructions for different changes to the control software of the automation system may also be stored on the memory unit.

Via an individual identification code of the software subscriber, the controller identifies the software subscriber as a subscriber of the automation system, wherein the software subscriber serves to effect a change in the control software of the automation system. Hereupon, the software subscriber sends the modification instructions stored on the memory unit to the controller.

The modification instructions of the software subscriber received by the controller are verified by the controller for compatibility with the existing control software, and the appropriate modification to the control software is carried out if the verification indicates that the particular change to the control software is compatible with the existing control software.

In the event of a negative verification result, i.e., if it is determined that the changes corresponding to the modification instructions are incompatible with the existing control software, the controller rejects the software subscriber's modification instructions and the existing control software remains unchanged.

By using the software subscriber and the modification instructions stored on the memory unit of the software subscriber, time-consuming programming to implement the modification instruction in the existing control software may be avoided, in that according to the described method the control system automatically obtains the desired modifications from the software subscriber and implements them independently if compatibility is positive.

The software subscriber may be programmed as required for this purpose, so that desired modifications to the control software may be stored in corresponding modification instructions on the memory unit of the software subscriber.

In order to modify the control software, it is thus sufficient to insert a software subscriber, which has stored the modification instructions corresponding to the desired modification of the control software on its memory unit, into the automation system, so that with the provided method for modifying a control software of an automation system, the controller implements the desired modification of the control software into the existing control software.

After successful modification of the control software, the software subscriber may remain in the automation system. The software subscriber or the modification instruction of the software subscriber may be embodied in such a way that the software subscriber remains unconsidered by the control system in further operation after the control software has been changed.

A modification instruction may be a part of the control software to be modified or an additional part of the control software. This may also include corrections of faulty parts of the control software or improved versions or newer versions in the form of updates of the control software.

In the present context, a data bus may be a field-bus system to which a plurality of subscribers are connected. The field-bus system may be realized via different protocols, for example: EtherCAT, Ethernet Power Link, CAN, Profibus, Profinet and other field bus protocols.

A subscriber is a subscriber of the field-bus system that may communicate independently with a controller or other subscribers of the bus system via data exchange.

A subscriber may have already been part of the automation system before the method for modifying a control software of an automation system was carried out.

A subscriber may comprise an input/output terminal and a device of the automation system. As a software subscriber, the subscriber may also consist exclusively of a corresponding software terminal. In the following, subscriber and terminal may be used synonymously if necessary. A subscriber may also be a computing unit. For example, in a bus system, in particular a field-bus system, a subscriber may be a master or a slave of the bus system.

An additional subscriber is a subscriber that may be integrated into the automation system with the implementation of the method for modifying a control software of an automation system, but was not a subscriber of the automation system before the implementation of the method for modifying a control software of an automation system.

A software subscriber is a subscriber of the automation system that is used to modify a control software of the controller and comprises a memory unit on which at least one modification instruction for modifying the control software of the automation system may be stored.

For example, a subscriber may have a terminal, in particular a bus terminal, which is embodied as a software subscriber or is embodied as an input/output terminal (I/O terminal) to which a field device, e.g. an actuator, a sensor or a motor, is connected.

A receiving of data may be a recording of data and a sending of data may be an outputting of data. For example, a receiving and sending of data by a subscriber may be performed while a data telegram passes through, in which the respective subscriber reads data from the telegram and inserts data into the same telegram, so that while the telegram passes through, data may be both read from the telegram, i.e. received, and inserted, i.e. sent out.

Sending and receiving of data may also be realized by sending and receiving corresponding data packets.

Data communication may be realized by sending and receiving data between the controller and subscribers or between subscribers themselves. Data communication may also be implemented by reading out and inserting data while a data telegram passes through.

According to an embodiment, the method for modifying a control software of an automation system further comprises: installing the software subscriber into the data bus and connecting the software subscriber to the controller in a first installation step, sending an identification query by the controller to the subscribers to identify the subscribers on the data bus in a first query step, sending an identification response by the software subscriber to the controller in a first response step, and identifying the software subscriber as a subscriber for modification of the control software by the controller based on the identification response in a first identification step.

This achieves the technical advantage of providing an efficient method for modifying a control software of an automation system.

A modification in the control software of an automation system may be achieved by installing the software subscriber in the data bus of the automation system. For this purpose, the software subscriber may be integrated at a suitable location in the automation system and entered into the data bus with appropriate connections to the respective wiring of the data bus.

With a corresponding identification query by the controller to the subscribers of the automation system, the controller may register each of the subscribers located on the data bus and identify them as a specific subscriber.

In this context, the controller recognizes the software subscriber as a subscriber of the automation system that is used to effect a modification in the control software of the automation system.

After the software subscriber is identified by the controller as a subscriber used to modify the control software of the automation system, the controller requests the software subscriber to transmit a corresponding modification instruction to modify the control software.

In this manner, complex programming in order to modify the control software can be avoided. Furthermore, the software subscriber responsible for modifying the control software does not have to be named to the controller in an additional programming effort.

According to another embodiment, the discarding step comprises: outputting an error message by the controller in an error message step.

This has the technical advantage of indicating to the user that the installed software subscriber is faulty, or that the modification instruction is not compatible with the existing control software.

According to a further embodiment, the method for modifying a control software of an automation system may be performed in a startup phase of the automation system, in which the automation system is not in operation, or in a running operation of the automation system.

This means that the automation system does not have to be set to a suitable state for modifying the control software of the automation system with the provided method.

Instead, a modification of the control software may be effected in a startup phase of the automation system. For this purpose, the software subscriber is inserted into the data bus of the automation system in a switched-off state of the automation system.

Subsequently, in a startup phase of the automation system, in which a startup of the control software is performed, the control system recognizes the additional software subscriber inserted into the automation system as an additional subscriber.

Following this, the software subscriber is identified by the controller as a software subscriber, as described above, and the software subscriber provides the controller with the corresponding modification instruction for modifying the control software.

Subsequently, the controller verifies the provided modification instruction for compatibility of the modification to the control software determined by the modification instruction with the existing control software and installs or implements the desired modification to the control software if the verification indicates compatibility of the desired modification with the existing control software.

The modification of the control software is thus completed during the startup phase of the automation system, in which the control software is started up, so that operation of the automation system may be carried out with modified control software before the startup phase is completed.

Alternatively, the modification of the control software according to the method may also be carried out during operation of the automation system. For this purpose, the software subscriber is inserted into an area of the automation system that is not in an operating state but in a configuration state at the time of installation.

After completion of the above-described installation of the software subscriber into the data bus of the automation system, the controller recognizes the software subscriber as an additional subscriber and performs the above-described steps for modifying the control software according to the modification instruction of the software subscriber. A modification of the control software may thus be completed before the respective part of the automation system is again guided into the operating state. Consequently, it is not necessary to stop the automation system to modify the control software.

According to an embodiment, the modification instruction comprises an identification, control software, specific operating parameters, licensing of the control software, or the like of at least one subscriber of the automation system.

This achieves the technical advantage that by modifying the control software with the modification instruction of the software subscriber, a modification of a control software of a subscriber of the automation system is effected.

For example, the method may be used to implement an additional subscriber or to replace an existing subscriber of the automation system with a new subscriber. In addition to the installation of the software subscriber described above, an additional subscriber may be added to the automation system or an existing subscriber may be replaced by a new subscriber for this purpose.

In the steps described as above, the software subscriber and the additional or new subscriber of the automation system are recognized by the controller as subscribers and the control software is modified according to the modification instruction of the software subscriber.

The modification of the control software comprises the insertion of the additional control software of the additional subscriber or the corresponding modification of the control software of the original subscriber, as well as the addressing and other steps necessary for the operation of the additional subscriber within the automation system by the controller.

After modifying the control software according to the modification instruction stored on the software subscriber, the additional subscriber is inserted into the automation system and may be controlled and operated.

As soon as a startup phase of the automation system is completed or the respective area of the automation system in which the software subscriber and the additional subscriber are installed is brought back into an operating state, the additional subscriber or, respectively, the new subscriber is inserted into the automation system and may be operated by the controller in accordance with the corresponding control software of the subscriber or the specific operating parameters of the subscriber.

After successful modification of the control software and successful installation of the additional subscriber, the software subscriber may remain in the automation system.

In addition, appropriate licensing of the control software of the additional or, respectively, the new subscriber may ensure that only subscribers that meet the relevant requirements, e.g. quality requirements or safety requirements, are inserted into an existing automation system, so that a quality and safety standard may be maintained.

An additional subscriber inserted into an existing automation system as described above may e.g. comprise an actuator, sensor, motor, or similar automation system device.

According to an embodiment, the software subscriber comprises a terminal, in particular a bus terminal, which is embodied for data transmission in a data bus, and a memory unit which is arranged in the terminal and on which at least one modification instruction may be stored, the terminal being further embodied to send the at least one modification instruction to the controller of the automation system.

This provides the technical advantage of simple installation of the software subscriber. To install the software subscriber, the respective bus terminal of the software subscriber may be connected to the bus lines of the data bus with the corresponding connections. The software subscriber may communicate with the controller via the data bus and the connecting unit of the bus terminal of the software subscriber. The connecting unit is used to provide communication with a controller or other subscribers in an automation system. The connecting unit may have a receiving unit and a transmitting unit and thus enable data to be received and transmitted.

Receiving and sending data may also be carried out while a data telegram passes through, during which the connecting unit may read data from the telegram and insert data into the same telegram. A corresponding modification instruction may be stored on the memory unit of the bus terminal.

Alternatively, a plurality of modification instructions may be stored on the memory unit of the bus terminal of the software subscriber.

After installation of the software subscriber in the automation system, the software subscriber may provide the modification instructions stored on the memory unit to the controller via the connecting unit of the bus terminal of the software subscriber after corresponding query messages from the controller.

According to an embodiment, the memory unit of the software subscriber cannot be written into with data by the controller during operation of the automation system.

This may be used to ensure that the software subscriber is only used to provide the modification instruction for modifying the control software. Thus, it may be avoided that after installation of the software subscriber the latter is used for other purposes by a subsequent write process.

It may also be ensured that if a plurality of software subscribers of the same type are installed, the corresponding additional subscribers are installed with the identical modification instruction. This may contribute to system security.

Furthermore, it may be avoided that a modification of the control software of the automation system is achieved that goes beyond the modification instruction stored on the memory unit of the software subscriber. Thus, the modification of the control software is traceable by the modification instruction stored on the memory unit of the software subscriber. If necessary, this facilitates error analysis in the event of a change to the control software that has resulted in faulty control software.

According to another embodiment, the subscribers of the automation system each comprise a bus terminal, in particular an I/O terminal and at least one actuator, a motor, a sensor or a further device for an automation system connected to the terminal, the terminal being embodied to be integrated into the data bus and to communicate with the controller and/or further subscribers via a data exchange.

This achieves the technical advantage that additional subscribers comprising an actuator, a motor, a sensor or a further device for an automation system may be inserted into the automation system by the provided method. Via the I/O terminals, the devices described above may be inserted into the data bus of the automation system and operated via the controller of the automation system.

Thus, as described above, any devices needed to carry out a modification in the automation system may be inserted into the existing automation system via the provided method.

The existing automation system may thus be easily expanded with additional devices or modified by replacing existing devices with new or different ones.

According to another embodiment, the terminal of the software subscriber and the subscriber terminals of the further subscribers are connectable in a terminal system comprising a plurality of terminals, wherein the terminals within the terminal system are interconnected by a data bus and may communicate with one another by data transmission via the data bus.

This achieves the technical advantage of compact wiring of the automation system. By combining the individual terminals of the subscribers of the automation system to result in one terminal system, a compact and space-saving interconnection of the devices of the automation system may be achieved.

An automation system is provided comprising a controller and a plurality of subscribers connected to the controller via a data bus and capable of communicating with the controller via the exchange of data, wherein the controller drives the plurality of subscribers with control software, wherein at least one subscriber is a software subscriber, wherein the software subscriber comprises a memory unit on which at least one modification instruction for modifying the control software of the controller is stored, wherein the controller is configured to send an individual query message to the software subscriber for querying the at least one modification instruction for modifying the control software, wherein the software subscriber is embodied to send the at least one control instruction for modifying the control software to the controller, wherein the controller is embodied to verify the at least one modification instruction for modifying the control software as to whether the modification instruction is compatible with the control software, wherein the controller is embodied to modify the control software according to the modification instruction if the modification instruction is compatible with the control software, and wherein the controller is embodied to discard the modification instruction if the modification instruction is not compatible with the control software.

This may provide an automation system that enables simplified modification of the control software of the automation system. Additional programming effort for modifying the control software of the automation system may thus be avoided.

After the controller recognizes the software subscriber as a subscriber for modifying the control software, the controller is capable of using a corresponding query message to drive the software subscriber to transmit a modification instruction stored on the software subscriber's memory unit.

After the software subscriber has transmitted the corresponding modification instruction to the controller, the controller is in turn able to verify the desired modification corresponding to the modification instruction for compatibility with the existing control software and, if compatibility is detected, to modify the control software in accordance with the modification instruction.

A programming effort by trained specialist personnel for modifying the control software of the automation system may be dispensed with in the automation system. A change of the control software may be effected automatically as described above by an installation of a software subscriber on which a corresponding modification instruction for modifying the control software of the automation system is stored.

According to another embodiment, the controller is further embodied to send an identification query to the subscribers for identifying the subscribers located in the data bus, wherein the software subscriber is embodied to send an identification response to the controller, and wherein the controller is embodied to identify the software subscriber as a subscriber for modifying the control software of the automation system based on the identification response.

This has the technical advantage that an automation system may be provided in which a change in the control software of the automation system may be achieved without an additional programming effort by a trained specialist.

As described above, all that is required to modify the control software in the automation system is installation of the corresponding software subscriber. After successful installation of the software subscriber, the controller identifies the software subscriber as a subscriber of the automation system that is used to modify the control software.

With this information, the controller is able, as described earlier, to get the software subscriber to provide the appropriate modification instruction to modify the control software of the controller.

With this modification instruction, the controller is in turn able to independently perform the appropriate modification to the control software, provided the appropriate modification is compatible with the existing control software.

According to an embodiment, the controller and the software subscriber are configured to perform a modification of the control software according to the at least one modification instruction in a startup phase of the automation system in which the automation system is not in operation, or in an ongoing operation of the automation system.

This has the technical advantage that an automation system may be provided which does not have to be set to a state specially intended for modifying the control software of the automation system.

Instead, the modification to the control software may be effected by the software subscriber during a startup phase of the automation system in which the automation system is powered up from a state in which the automation system is not operating to an operating state.

As already described above, after installation of the software subscriber, the controller recognizes the software subscriber as an additional subscriber of the automation system in addition to the already existing subscribers of the automation system when the control software is started up.

Further, the controller identifies the software subscriber as a subscriber used to modify the control software, and causes the software subscriber to provide a modification instruction or a plurality of modification instructions stored on a memory unit of the software subscriber to the controller with corresponding query messages.

In the course of the start-up of the control software, the control system checks the modifications corresponding to the modification instructions with regard to compatibility with the already existing software and, if compatibility exists, carries out the respective modifications to the control software.

When the startup phase is completed, the automation system may thus be operated with the correspondingly modified control software.

Alternatively, the modification of the control software may also be carried out during operation of the automation system. For this purpose, the software subscriber may be installed in an area of the automation system that is not in an operating state but in a configuration state at the time of the desired modification of the control software.

For this purpose, the controller may be embodied to set parts of the automation system that are not active at a certain point in time to a configuration state in which configuration processes are performed. Configuration processes may include verification processes regarding the state of the subscribers, regarding the assignment of the subscribers and regarding other factors that must be verified for smooth operation of the respective subscribers and the automation system.

The controller is thus able to recognize the software subscriber as an additional subscriber of the automation system by sending out appropriate query messages in configuration mode and to identify it as a subscriber that is used to modify the control software.

Subsequently, the controller is able to drive the software subscriber to provide the modification instruction and make the appropriate modification to the control software, if necessary, if it is compatible with the existing control software.

For this purpose, the controller sends out corresponding query messages to the subscribers in the area of the automation system that is in the configuration state at the time the control software is modified, in order to identify the subscribers located there and, if necessary, to detect a topology change of the automation system by adding an additional subscriber, e.g. the software subscriber.

Thereupon, the controller is capable of identifying the software subscriber as a subscriber serving to modify the control software and driving the software subscriber to provide the appropriate modification instruction to modify the control software. Subsequently, the controller is capable of making a modification to the control software in accordance with the provided modification instructions if such a modification is compatible with the existing control software.

The corresponding modification of the control software here preferably refers to subscribers of the area that is in the configuration state at the time of the modification of the control software. In this way, it may be avoided that a change is made to the control software with regard to subscribers which are already in the operating state.

As soon as the subscribers of the area for which the modification of the control software was carried out and which was in the configuration state at the time of the modification of the control software are brought back into the operating state, the modification of the control software is finished and the respective subscribers may be operated with correspondingly modified control software.

According to a further embodiment, the controller is configured to add an additional subscriber to the control system by modifying the control software based on the at least one modification instruction.

This achieves the technical advantage of providing an automation system in which an extension of the automation system by adding additional subscribers is feasible without an additional programming effort by trained personnel.

For this purpose, an additional subscriber may be inserted into the automation system in addition to the software subscriber, wherein the control software required for the operation of the additional subscriber as well as specific operating parameters and further information are stored on the memory unit of the software subscriber.

As described above, the controller recognizes the software subscriber and the additional subscriber as new subscribers of the automation system by sending corresponding query messages and identifies the software subscriber as a subscriber that serves to modify the control software. In the subsequent steps, the controller may carry out the change to the control software of the automation system based on the modification instruction and thus add the additional subscriber to the control software.

Once the modifications to the control software have been completed, the additional subscriber may be put into operation by the control system. This means that no additional programming effort is required by trained specialists to enter the additional subscriber in the control software of the controller.

Consequently, a simple extension of the automation system by adding additional devices or subscribers or a modification of the automation system by replacing existing devices or subscribers by new or different devices or subscribers may be realized by installing only the respective subscriber or a plurality of subscribers to be inserted into the automation system for extension and a corresponding software subscriber on the memory unit of which the respective control software or the corresponding operating parameters and the respective instructions for the corresponding modification of the control software are stored.

The corresponding modification in the control software is then carried out automatically by the control system in the steps described above.

After modifying the control software according to the software stored on the software subscriber, the additional subscriber or the plurality of additional subscribers and the respective devices of these subscribers may be controlled by the control system of the automation system and operated within the automation system.

According to an embodiment, the modification instruction comprises an update or modification to the control software.

This provides an easy-to-implement modification of the control software. Thus, e.g. to carry out an update or to install a newer version of the control software, a software subscriber may be installed in the system on the memory unit of which the corresponding update or the corresponding newer version of the control software is stored. Installation of the update or the newer version of the control software may then be performed automatically by the controller as described above.

Thus, for example, the execution of an update or the installation of a newer version of the control software may be performed in an offline state of the automation system, in which the automation system does not have access to a network server comprising the corresponding update or the corresponding newer version of the control software.

Furthermore, the update or installation of the newer version of the control software does not require any additional programming by trained personnel.

The software subscriber may thus also be used exclusively for modifying the control software of an automation system without introducing an additional subscriber into the automation system in the process, as an extension of the automation system or as a replacement for an already existing subscriber.

Thus, an automatic change of the control software may be achieved via the installation of the software subscriber.

According to another embodiment, the modification instruction comprises an identification, a control software, specific operating parameters, licensing of the control software, or the like of at least one subscriber of the automation system.

This means that by installing the software subscriber and an additional subscriber, an expansion of the automation system may be achieved without the need for additional programming effort to modify the control software of the automation system accordingly.

As described above, after identifying the software subscriber and the subscriber, the controller is capable of entering the corresponding control software of the additional subscriber or specific operating parameters or further identification characteristics of the additional subscriber, each of which is stored on the memory unit of the software subscriber, into the control software of the automation system. Thus, the added subscriber may be controlled by the control system after completion of the modifications to the control software of the automation system.

A software terminal for modifying a control software of a controller of an automation system is provided, wherein the automation system comprises a plurality of subscribers which are connected to the controller via a data bus, wherein the software terminal is a subscriber in the control system and is embodied as a bus terminal for use in the data bus, wherein the software terminal has at least one memory unit, on which at least one modification instruction for modifying a control software of the automation system may be stored, and wherein the software terminal has a connecting unit which is embodied to communicate with the controller and/or other subscribers of the data bus via the exchange of data and to provide the controller of the automation system with at least one modification instruction stored on the memory unit for modifying the control software of the automation system.

This achieves the technical advantage of providing a simple solution for modifying a control software of an automation system.

With the software terminal, a modification in the control software of the automation system may be achieved by inserting the software terminal into the automation system at an appropriate location and the controller performing a modification in the control software of the automation system based on the modification instruction stored on a memory unit of the software terminal.

For this purpose, the controller and the connecting unit of the software terminal communicate with each other by exchanging corresponding query messages and response messages via a data bus of the automation system, and the software terminal provides the controller with the corresponding modification instruction via the connecting unit.

The installation of the software terminal is very simple and only requires connecting the corresponding contacts of the software terminal with the respective bus lines of the data bus of the automation system.

According to an embodiment, the software terminal may be connected to the subscriber terminals of further subscribers, wherein the software terminal may communicate with the subscriber terminals via a data bus line of the automation system.

This has the technical advantage that the software terminal may be combined with further subscriber terminals of the automation system to form a terminal system. The individual terminals of the terminal system may communicate with one another via a corresponding data bus line, for example a K-bus (communication bus). This in turn achieves a compact design of the wiring of the automation system.

A terminal system for use in an automation system is provided, comprising: a plurality of subscriber terminals and at least one software terminal, wherein the plurality of subscriber terminals and the at least one software terminal are configured as bus terminals and are interconnected via an internal bus line of the terminal system, and a bus coupler, wherein the bus coupler is configured to connect the terminal system to a data bus of the automation system, and wherein the at least one software terminal comprises a connecting unit and at least one memory unit and is embodied to provide, via the connecting unit of a controller of the automation system, at least one modification instruction stored on the memory unit for modifying a control software of the automation system.

This achieves the technical advantage of providing a compact unit that makes it possible to effect a simple modification in the control software of an automation system. Furthermore, the terminal system may be used to extend an automation system by additional subscribers.

By installing the terminal system and the software terminal arranged therein, a modification of the control software of the automation system as described above may be achieved by providing a modification instruction of the controller stored on a memory unit of the software terminal via a corresponding communication between the controller and the software terminal of the terminal system, and causing a corresponding modification of the control software by the controller according to the modification instruction.

If the modification instruction of the control software comprises additional terminals of the terminal system or specific operating parameters of these terminals, these additional subscriber terminals of the terminal system may be inserted into the automation system by changing the control software of the automation system on the basis of the modification instruction of the software terminal and may be controlled with the modified control software.

Thus, additional devices may be added to the automation system by installing the terminal system. Alternatively, existing devices in the automation system may be replaced by new or other devices.

BRIEF DESCRIPTION OF THE DRAWINGS

In the following, the invention is explained in more detail with reference to preferred embodiments, which show.

DETAILED DESCRIPTION

Figure 1:
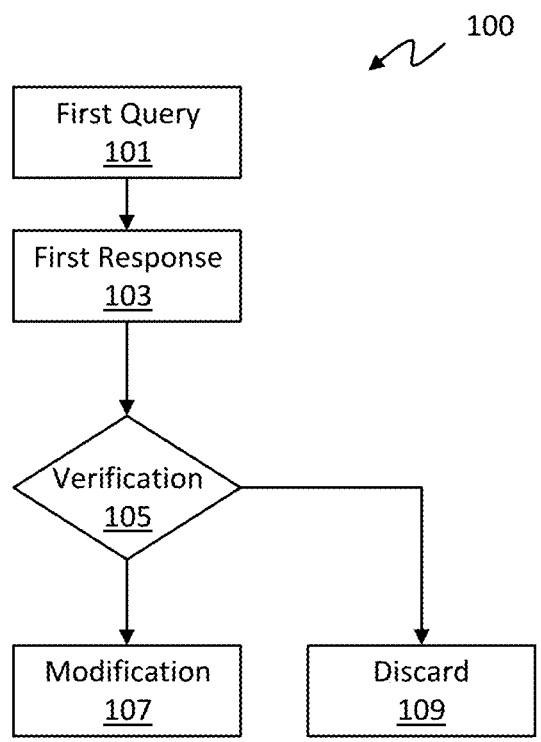
FIG. 1 is a flowchart of a method for modifying a control software of an automation system according to a first embodiment.

FIG. 1 shows a flowchart of a method 100 for modifying a control software of an automation system according to a first embodiment. For better understanding, the method is always described in connection with the structure according to FIG. 3, FIG. 4 and FIG. 5.

Here, the automation system 300 comprises a controller 301 and a plurality of subscribers 303, 305, 401, wherein the subscribers 303, 305, 401 are connected to the controller 301 via a data bus 307 and communicate via a data exchange.

A subscriber 305 is a subscriber of the automation system 300 that was already a subscriber of the automation system 300 prior to performing the method 100 for modifying a control software of an automation system 300.

An additional subscriber 401 is a subscriber that may be integrated into the automation system 300 with the implementation of the method 100 for modifying control software of an automation system 300, but was not a subscriber of the automation system 300 before the implementation of the method 100 for modifying control software of an automation system 300.

An additional subscriber 401 is not a software subscriber 303. An additional subscriber 401 may include devices of the automation system 300, such as actuators, sensors, motors, or other devices.

A software subscriber 303 is a subscriber of the automation system 300 for modifying a control software of the controller 301, and comprises a memory unit on which at least one modification instruction for modifying the control software of the automation system 300 is stored.

A data bus 307 may be implemented via a field-bus system. Such a field-bus system may e.g. be EtherCAT, Ethernet, Profibus or comparable field-bus systems.

The method 100 comprises the following steps:

sending an individual query message by the controller 301 to the software subscriber 303 to query the at least one modification instruction to modify the control software in a first query step 101;

sending a response message by the software subscriber 303 to the controller 301 for providing the at least one modification instruction to modify the control software in a first response step 103;

verifying whether the at least one control software modification instruction by the controller 301 is compatible with the control software in a verification step 105;

modifying the control software in accordance with the modification instruction by the controller 301 in a modification step 107 if the modification instruction is compatible with the control software; and discarding the modification instruction by the controller 301 in a discard step 109 if the modification instruction is incompatible with the control software.

The controller 301 recognizes the software subscriber 303 among all subscribers of the automation system 300 as a subscriber that is used to modify the control software. Based thereon, in a first query step 101, the controller 301 sends an individual query message to the software subscriber 303 to cause the software subscriber 303 to provide the modification instruction stored on a memory unit 501 of the software subscriber 303 for modifying the control software.

Subsequently, in a first response step 103, the software subscriber 303 sends a response message to the controller 301. In this case, the response message of the software subscriber 303 comprises the modification instruction for modifying the control software, which is stored on the memory unit 501 of the software subscriber 303. For this purpose, the software subscriber 303 comprises a connecting unit 503, by which the software subscriber 303 may communicate with the controller 301 via the data bus 307.

Alternatively, the memory unit 501 of the software subscriber 303 may store a plurality of modification instructions for modifying the control software. In such a case, the software subscriber 303 may transmit the entirety of the plurality of control software modification instructions to the controller 301 in a single response message.

Alternatively, the plurality of modification instructions may each be transmitted individually to the controller 301 in a plurality of response messages. Optionally, individual modification instructions may also be requested sequentially by the controller 301 through corresponding individual query messages.

A modification instruction for modifying the control software may e.g. comprise an update or a new version of the control software. Alternatively, a modification instruction may also include a modification or a correction of possible malfunctions of the control software.

Furthermore, a modification instruction for modifying the control software may be a control software of an additional subscriber 401 not previously integrated into the automation system 300. In this case, the modification instruction may additionally comprise specific operating parameters of such an additional subscriber 401 or further identification characteristics of the additional subscriber 401.

Such identifiers may e.g. describe the type of the particular additional subscriber 401. For example, an additional subscriber 401 may comprise an actuator, a sensor, a motor or other device for an automation system. In this context, the specific operating parameters may include a range of use or load and/or a preferred range of operation and other information of the respective additional subscriber 401.

Additionally, a control software modification instruction may include licensing the control software of a subscriber 305, 401. Licensing the control software may ensure that only subscribers that are operated via the appropriate control software and meet the desired quality or assurance requirements of the automation system are included in the automation system 300.

After the controller 301 receives the modification instruction to modify the control software, the controller 301, in a verification step 105, verifies the modification instruction to determine whether the change to the control software requested according to the modification instruction is compatible with the existing control software.

For example, the controller 301 checks whether the update or the new version of the control software contained in the modification instruction complies with the requirements of the automation system 300. For this purpose, it may e.g. be verified that the modification instruction may be integrated into the existing control software, or whether further changes may be necessary. Thus, it may be verified that the current version of the software is used. It may be checked whether the correct interfaces are available for the software modification of the modification instruction. Also, the origin of the modification instruction may be checked for the respective manufacturer to ensure that only software signed as authentic is used in the modification instruction.

Likewise, the controller 301 may check whether the control software or the specific operating parameters of the additional subscriber 401 may be integrated into the existing control software.

For example, it may be verified that the actuator, sensor, motor, or other device of the additional subscriber 401 meets the requirements of the existing automation system 300 and thus may be included in the automation system 300 as an additional subscriber. For example, it may be verified that the actuator, sensor, motor, or other device of the additional subscriber 401 has the characteristics intended for corresponding devices in that area of the automation process. It may also be verified that the additional device of the additional subscriber matches other devices of the automation system with the respective configuration of the device.

Alternatively, other properties of the additional subscriber 401 that are not listed may be checked, as well.

In addition, it may be verified that the associated control software of the additional subscriber 401 may be inserted into the existing control software without malfunctions occurring or additional programming effort by trained specialist personnel becoming necessary.

If it is determined in the verification step 105 that the modification instruction is compatible with the control software, the controller 301, in a modification step 107, changes the existing control software of the automation system 300 in accordance with the modification instruction of the software subscriber 303.

In this regard, the modification of the control software may comprise an implementation of the update and/or the new version of the control software. Alternatively, the modification of the control software may comprise an implementation of the control software of an additional subscriber 401 and/or specific operating parameters and/or further identification characteristics of the additional subscriber 401. Furthermore, a modification to the control software may comprise an implementation of a licensing of the control software of the additional subscriber 401.

By implementing the control software, the specific operating parameters, and the further identification characteristics of the additional subscriber 401, respectively, into the existing control software of the automation system 300, the additional subscriber 401 may be inserted into the automation system 300 so that the additional subscriber 401 may be controlled via the control software of the automation system 300.

If the controller 301 determines in the verification step 105 that the modification instruction is incompatible with the existing control software of the automation system 300, the modification instruction is discarded by the controller 301 in a discard step 109, and a modification to the control software in accordance with the modification instruction does not occur. Additionally, a corresponding error message may be output. Furthermore, the automation system 300 may switch to an error state to correct the corresponding error, i.e., to replace the non-compatible software sub scriber 303.

The controller 301 of the automation system 300 may e.g. be a control computer, a control PC, or a server-based control unit.

A subscriber 305, 401 of the automation system 300 that is not a software subscriber 303 may e.g. include an actuator, sensor, motor, or other automation system device.

A software subscriber 303 may be embodied as a real component and may e.g. comprise a bus terminal. A subscriber 305, 401 of the automation system 300 that is not a software subscriber 303 may e.g. comprise an I/O terminal and a corresponding automation system device.

Figure 2:
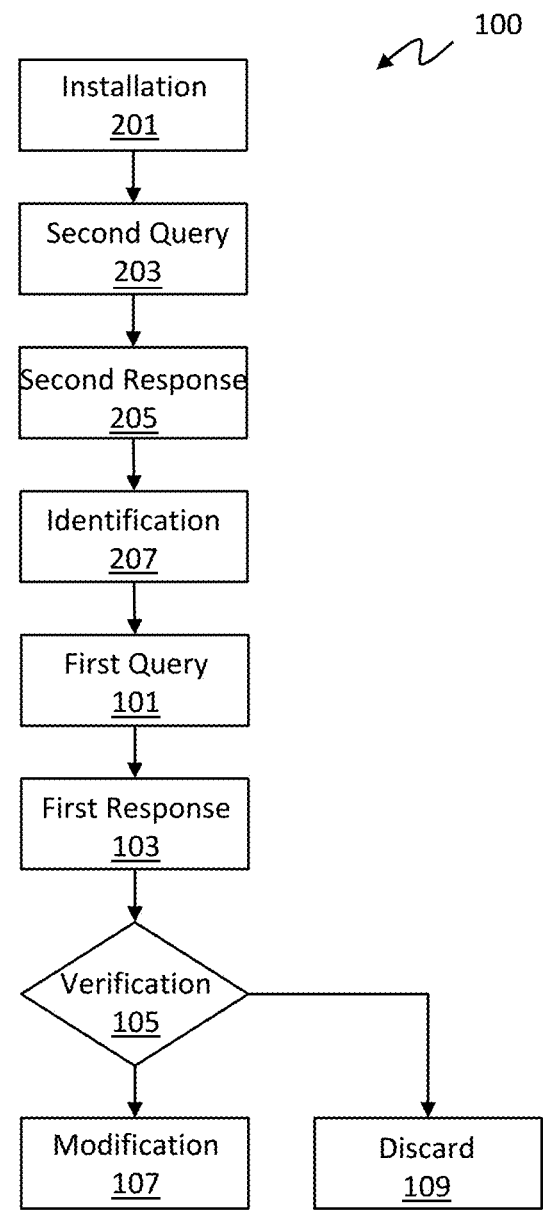
FIG. 2 is a flowchart of the method for modifying a control software of an automation system according to a further embodiment.

FIG. 2 shows a flowchart of the method 100 for modifying a control software of an automation system 300 according to another embodiment.

According to FIG. 2, the method 100 comprises an installation step 201 of implementing the software subscriber 303 into the data bus 307 and connecting it to the controller 301.

As described above, the software subscriber 303 may be formed as a real component and may e.g. comprise a bus terminal. Thus, to install the software subscriber 303, the software subscriber 303 may be connected to its system terminals, such as the terminals of the bus terminal for coupling the bus terminal to a data bus, to a corresponding data line of the data bus 307.

Electrical connections of the respective terminals of the software subscriber 303 to the corresponding bus lines of the data bus 307 may be used to connect the software subscriber 303 to the controller 301 of the automation system.

After installing the software subscriber 303 into the data bus 307 and connecting the software subscriber 303 to the controller 301 in the installation step 201, the controller 301 sends an identification query to the subscribers 303, 305, 401 of the automation system in a second query step 203 to identify the subscribers 303, 305, 401.

The identification query may be a general query sent by the controller 301 to all subscribers of the automation system 300 and used to identify the subscribers located in the automation system 300. Alternatively, the identification query may be an individual identification query sent by the controller 301 to particular subscribers of the automation system 300, respectively, for identifying only those particular subscribers.

In the following, an identification of a subscriber of the automation system 300 is understood as a knowledge of the respective type of subscriber. For this purpose, the identification may first comprise the recognition that a component inserted into the automation system 300 is a subscriber of the automation system 300 that is configured to communicate with the controller and/or other subscribers via a data exchange.

Further, an identification may include information regarding the type or function of the particular subscriber, e.g. whether the particular subscriber is one that comprises an automation system device 300, such as an actuator, sensor, motor, or similar automation system device, or whether the particular subscriber is one that, like the software subscriber 303, does not comprise an automation system device 300 but serves another function.

After receiving the identification query by the subscribers 303, 305, 401 of the automation system 300, the software subscriber 303 sends an identification response to the controller 301 in a second response step 205. In this identification response, the software subscriber 303 identifies itself as a subscriber of the automation system 300 that is used to modify the control software of the automation system 300.

In addition to the software subscriber 303, all further subscribers 305, 401 of the automation system 300 that are not a software subscriber 303 may also send an identification response to the controller 301. In the respective identification responses of the subscribers 305, 401 that are not the software subscriber 303, information may be included regarding the function of the respective subscriber in the automation system 300 or regarding the design and function of the respective devices of the corresponding subscriber. Further information may be included, as well.

After receiving the identification response from the software subscriber 303 by the controller 301, in an identification step 207, the controller 301 identifies the software subscriber 303 as a subscriber for modifying the control software of the automation system 300 based on the identification response from the software subscriber 303.

In this context, identification of the software subscriber 303 by the controller 301 may include matching an identification identifier of the software subscriber 303 included in the identification response of the software subscriber 303 with identification characteristics known to the controller 301 and e.g. stored in a corresponding database.

The method 100 of modifying a control software of an automation system 300 according to FIG. 1 or according to FIG. 2 may be performed in a startup phase of the automation system 300, in which the automation system 300 is not in operation, or in a running operation of the automation system 300.

For example, a software subscriber 303 may be installed into the data bus 307 of the automation system 300 according to the installation step 201 when the automation system 300 is not being operated and is in a switched-off state. When the automation system 300 is started after installation of the software subscriber 303, the newly installed software subscriber 303 is recognized by the controller 301 as a new subscriber of the automation system 300 during an initialization phase in which the control software is started up, and is identified as a subscriber used to modify the control software according to the second query step 203, the second response step 205, and the identification step 207.

Subsequently, in accordance with the first query step 101, the controller 301 will drive the software subscriber 303 to provide the software subscriber 303 modification instruction.

After the software subscriber 303 sends the modification instruction to the controller 301 in accordance with the first response step 103 and the controller 301 reviews the modification instruction in accordance with the verification step 105, the controller 301 will implement the modification to the control software in accordance with the modification instruction in accordance with modification step 107 if the verification has determined compatibility between the desired modification and the existing control software.

Otherwise, the modification instruction is discarded by the controller 301 in accordance with the discard step 109 and the control software is left unmodified.

At completion of the startup phase in which the control software of the automation system 300 is initialized and the subscribers 303, 305, 401 of the automation system 300 are set to an operational state, a modification of the control software according to the method 100 for modifying a control software of an automation system 300 is completed, so that the automation system 300 may be operated with modified control software.

Alternatively, the method 100 for modifying a control software of an automation system 300 comprising the above steps may also be performed when the automation system 300 is in an operation state. For this purpose, the corresponding software subscriber 303 is installed according to the installation step 201 in an area of the automation system 300 that is in a configuration state at the time of installation of the software subscriber 303 and in which the respective subscribers of this area of the automation system 300 are not operated.

For this purpose, an identification of the software subscriber 303 by the controller 301 according to the second query step 203, the second response step 205, and the identification step 207 takes place while the subscribers of this section of the automation system 300 are in the configuration state.

Subsequently, the controller 301 requests the software subscriber 303 to provide the modification instruction in accordance with the first request step 101.

After the software subscriber 303 provides the modification instruction in accordance with the first response step 103, the controller 301 verifies the modification instruction for compatibility of the modification instruction with the existing control software in accordance with the verification step 105 and modifies the control software in accordance with the modification instruction in the modification step 107 if the modification instruction is compatible with the control software.

Thus, the modification of the control software according to the method 100 for modifying a control software of an automation system 300 is completed before the configuration tasks of the controller 301 are completed and the corresponding part of the automation system is moved from the configuration state to an operational state.

Thus, the corresponding subscribers 303, 305, 401 of the corresponding section of the automation system 300 may be operated with modified control software after the configuration state is completed.

According to another embodiment, modifying the control software in accordance with the software subscriber 303 modification instruction may include adding at least one additional subscriber 401 other than the software subscriber 303 to the data bus 307 of the automation system 300.

To this end, an additional subscriber 401 may be installed in the data bus 307 and connected to the controller 301 in addition to the software subscriber 303 in the installation step 201. Such an additional subscriber 401 may include, for example, an I/O terminal and a device for an automation system, such as an actuator, a sensor, a motor, or a similar device. Thus, to install this additional subscriber 401, the corresponding I/O terminal may be connected to the data lines of the data bus 307 by the respective connections.

In such a case, the software subscriber 303 modification instruction may include control software of the additional subscriber 401, specific operating parameters of the additional subscriber 401, individual identification characteristics of the additional subscriber 401, licensing of the control software of the additional subscriber 401, and further information regarding the additional subscriber 401.

After installing the software subscriber 303 and the additional subscriber 401 according to the installation step 201, the controller 301 sends an identification query to the subscribers 303, 305, 401, in particular to the software subscriber 303 and the additional subscriber 401, in the second query step 203.

Subsequently, the software subscriber 303 sends an identification response to the controller 301 in the second response step 205. The identification response comprises identification information regarding the software subscriber 303 that identifies the software subscriber 303 as a subscriber used to modify the control software of the automation system 300.

The identification response of the software subscriber 303 further comprises identification information regarding the additional subscriber 401, which may be stored on the memory unit 501 of the software subscriber.

Based on the identification response of the software subscriber 303, the controller 301 identifies the software subscriber 303 as a subscriber for modifying the control software in the identification step 207. In addition, based on the identification response of the software subscriber 303, the controller 301 identifies the additional subscriber 401 as a subscriber the control software, specific operating parameters, further identification characteristics, and additional information of which are provided as a modification instruction by the software subscriber 303 in the identification step 207.

Subsequently, in a first query step 101, the controller 301 sends an individual query message to the software subscriber 303 to request the modification instruction to modify the control software.

In the subsequent first response step 103, the software subscriber 303 sends the modification instruction to the controller 301. As mentioned above, the modification instruction in this case comprises the control software of the additional subscriber 401, specific operating parameters of the additional subscriber 401, further identification characteristics of the additional subscriber 401, a licensing of the control software of the additional subscriber 401, and further information regarding the additional subscriber 401 to the controller 301.

Subsequently, the controller 301 verifies the compatibility of the modification instruction in the verification step 105. In this regard, the controller 301 may verify that the additional subscriber 401 may be inserted into the already existing automation system 300.

For example, the controller 301 verifies the function of the additional subscriber 401, or whether the additional subscriber 401 comprises a device that may e.g. be an actuator, a sensor, or a motor, and the extent to which that device fits within the existing automation system 300.

Furthermore, in this context, the controller 301 checks the specific operating parameters of the additional subscriber 401 to determine whether the additional subscriber 401 complies with the specifications of the existing automation system 300 in this respect. For example, it is verified that the hardware, in particular the devices, of the additional subscriber 401 may be inserted into the existing automation system 300 at the appropriate location without damaging them or other devices of the automation system 300. For this purpose, it may be checked whether the operating data of the respective devices is within the limit ranges provided by the controller for these devices.

For example, it is possible to verify that the speed of a motor of an additional subscriber 401 is within the speed range intended for motors to be installed in that particular area of the automation system. The invention is not intended to be limited to this.

Further, it may be verified that the computing power required to operate the additional subscribers 401 is available to the controller 301 of the automation system 300.

If the controller 301 detects a compatibility of the modification instruction with the control software in the verification step 105, the controller 301 changes the control software according to the modification instruction in the modification step 107. Hereby, the additional subscriber 401 is inserted into the automation system 300 and may be individually controlled by the controller 301 from now on.

Taking into account the licensing of the control software of the additional subscriber 401, it may be ensured that only additional subscribers 401 that meet corresponding quality and safety requirements are inserted into the automation system 300.

After the control software has been modified according to the modification instructions and the additional subscriber 401 has been installed, the automation system 300 may be operated with modified control software and the additional subscriber 401.

Additionally, a plurality of additional subscribers 401 may also be added to the automation system 300 using the steps described above. In this case, the software subscriber 303 modification instruction may include the control software, specific operating parameters, identification characteristics, control software licensing, and other information specific to the plurality of additional subscribers 401.

Alternatively, a plurality of modification instructions may be stored on the memory unit 501 of the software subscriber 303, each modification instruction comprising information relating to an additional subscriber 401.

Alternatively, a plurality of software subscribers 303, each of which comprises a modification instruction containing information regarding only one additional subscriber 401, may be inserted into the automation system 300.

Figure 7:
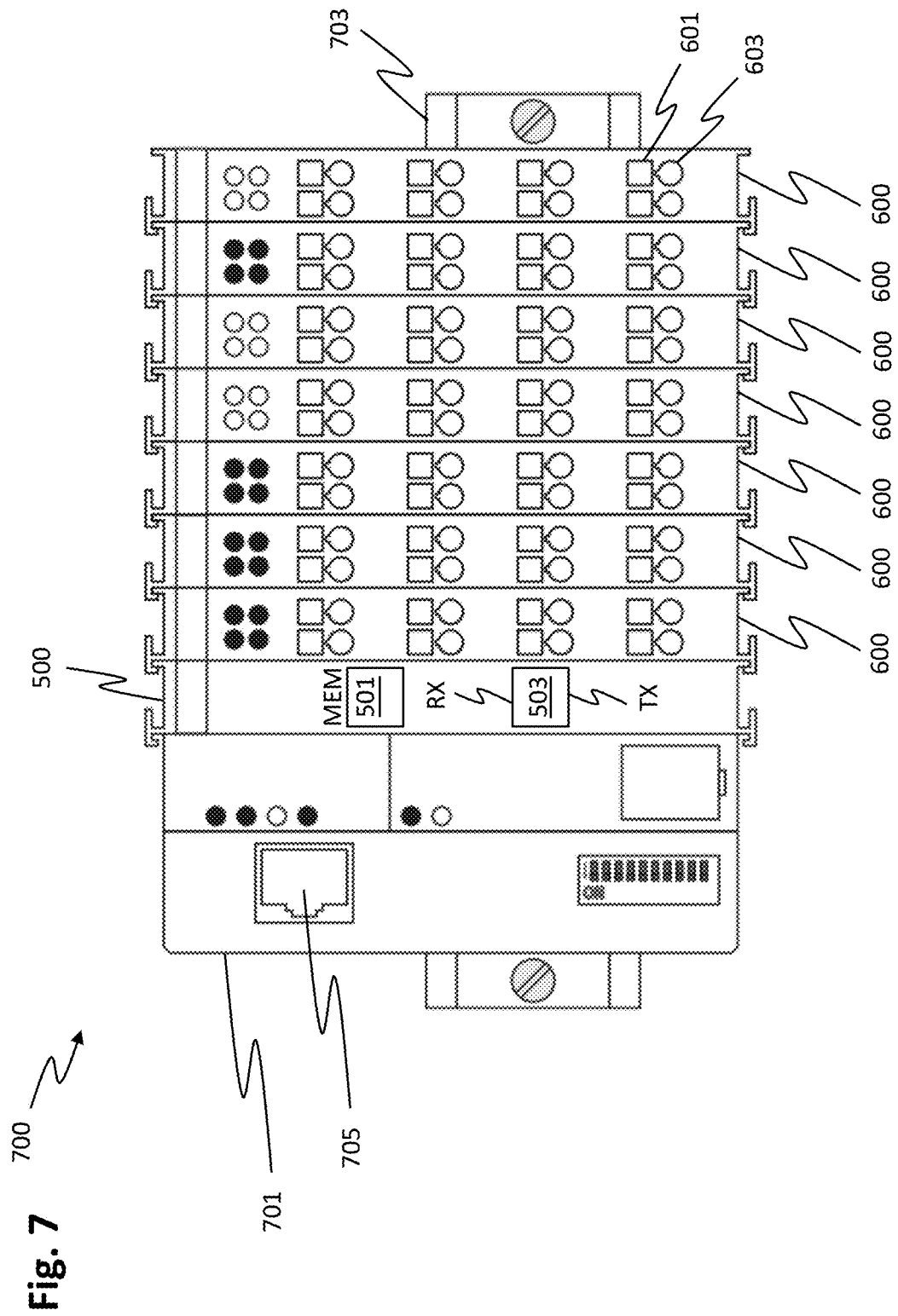
FIG. 7 is a schematic depiction of a terminal system with a software terminal and a plurality of further subscriber terminals according to another embodiment.

For example, the plurality of additional subscribers 401 may be combined with the software subscriber 303, or with multiple software subscribers 303, to form a terminal system 700, such as shown in FIG. 7.

After installing the plurality of additional subscribers 401 into the automation system 300 and correspondingly modifying the control software in accordance with the steps described above, each of the plurality of additional subscribers 401 may be individually controlled by the controller 301.

Figure 3:
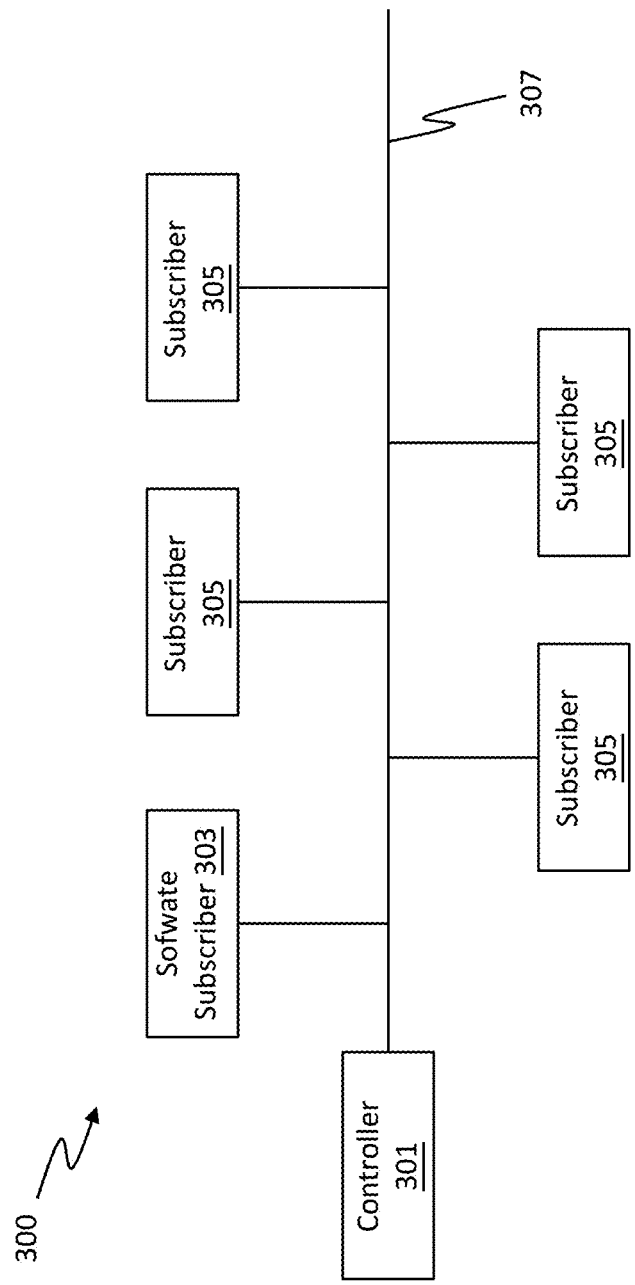
FIG. 3 is a schematic diagram of an automation system according to a first embodiment.

FIG. 3 shows a schematic diagram of an automation system 300 according to a first embodiment.

The automation system 300 in FIG. 3 comprises a controller 301 and a plurality of subscribers 305 that are connected to one another and to the controller 301 via a data bus 307. In addition, the automation system 300 comprises a software subscriber 303 that is connected to the subscribers 305 and the controller 301 via the data bus 307.

A subscriber 305 is a subscriber of the automation system 300 that was already part of the automation system 300 prior to performing the method 100 for modifying control software of an automation system 300, and that is not a software subscriber 303.

For example, a subscriber 305 as shown in FIG. 3 may include devices, such as actuators, sensors, or motors, of the automation system 300.

A software subscriber 303 is used to modify a control software of the controller 301 and comprises a memory unit on which at least one modification instruction for modifying the control software of the automation system 300 is stored.

The software subscriber 303 is recognized by the controller 301 as a subscriber of the automation system 300, and is thus an equal subscriber. However, the software subscriber 303 may be configured to serve solely to modify the control software without having any other function within the automation system.

The automation system 300 shown in FIG. 3 is configured to perform the method 100 of modifying the control software of an automation system 300, comprising the steps described above.

In the embodiment shown in FIG. 3, no additional subscriber 401 is added to the automation system 300.

An additional subscriber 401 is a subscriber that may be integrated into the automation system 300 with the implementation of the method 100 for modifying a control software of an automation system 300, but was not a subscriber of the automation system 300 before the implementation of the method 100 for modifying a control software of an automation system 300.

Thus, the modification instruction of the software subscriber 303 comprises only modifications to the existing control software of the automation system 300. These modifications may e.g. comprise an update, a newer version of the control software, or modifications or corrections to existing malfunctions of the control software.

The topology of the automation system 300 shown in FIG. 3 is chosen for illustrative purposes only because of its simple representation. The automation system 300 may also have a different topology. Likewise, the software subscriber 303 may be arranged at a different location in the automation system 300. A plurality of software subscribers 303 may also be integrated into the automation system 300.

The controller 301 is embodied to send a query message according to the first query step 101 to the software subscriber 303. The software subscriber 303 is embodied to send a corresponding response message according to the first response step 103 to the controller 301 for providing the at least one modification instruction.

In turn, the controller 301 is embodied to verify the modification instruction from the software subscriber 303 according to the verification step 105 and to modify the control software according to the modification instruction in a modification step 107 if the modification instruction is compatible with the control software. Otherwise, the controller 301 is embodied to discard the modification instruction according to the discard step 109 and refrain from modifying the control software.

The controller 301 is further embodied to send an identification query to the subscribers 303, 305 of the automation system 300 according to the second query step 203. The software subscriber 303 is in turn embodied to send an identification response to the controller 301 in accordance with the second response step 205. The controller 301 is in turn embodied to identify the software subscriber 303 based on the identification response according to the identification step 207.

Moreover, the controller 301 and the software subscriber 303 may be configured to perform a modification to the control software in accordance with the method 100 for modifying the control software of an automation system 300 during a startup phase of the automation system 300 or during ongoing operation of the automation system 300.

Figure 4:
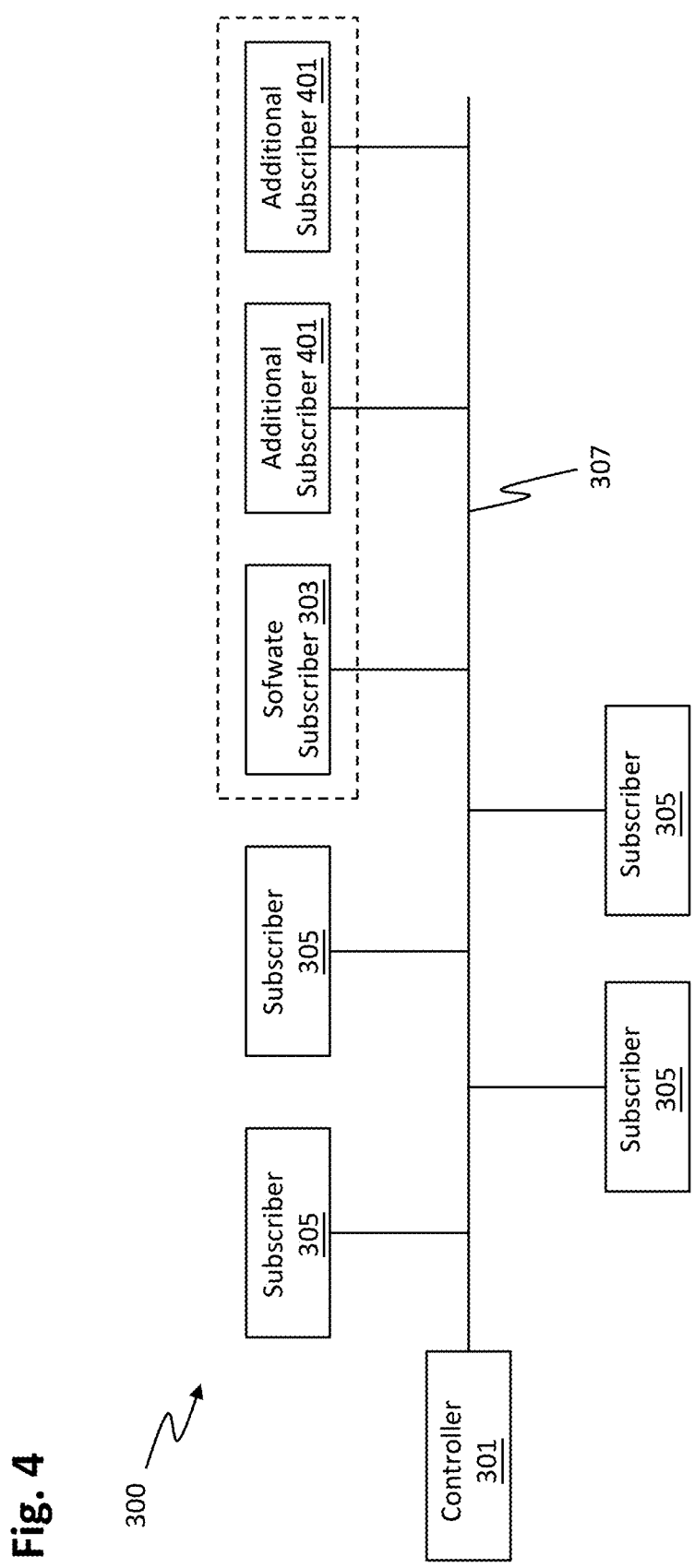
FIG. 4 is a schematic depiction of an automation system according to a further embodiment.

FIG. 4 shows a schematic diagram of an automation system 300 according to a further embodiment.

In contrast to the automation system 300 of FIG. 3, the automation system 300 of FIG. 4 comprises additional subscribers 401. The additional subscribers 401 are arranged in series after a software subscriber 303. With the dashed box, it is made clear that the software subscriber 303 and the respective additional subscribers 401 are connected to one another in such a way that the software subscriber 303 comprises the corresponding modification instructions for the respective additional subscribers 401.

In accordance with the above-described method 100 for modifying a control software of an automation system 300, the additional subscribers 401 may be inserted into the automation system 300 via a corresponding modification instruction from the software subscriber 303.

For this purpose, the software subscriber 303 modification instruction comprises the control software, specific operating parameters, possible licensing of the control software, other identifying and additional information of the additional subscribers 401.

The data transmission or communication between the controller 301 and the subscribers 303, 305, 401 of the automation system 300 may e.g. be based on a field-bus system.

This may e.g. be an EtherCAT system or a similar system in which the controller 301 acts as a master and the individual subscribers 303, 305, 401 act as slaves, in which only the master is configured to send out query messages to the slaves, and the slaves are configured exclusively to respond to these query messages with corresponding response messages.

The data communication between the master and the slaves may be realized by exchanging telegrams of a field bus protocol, for example EtherCAT. Such telegrams may include query messages or functional instructions from the master to a majority of the subscribers 303, 305, 401 of the automation system 300 or individual query messages or functional instructions to individual subscribers of the automation system 300.

For this purpose, the subscribers 303, 305, 401 of the automation system 300 may each have a receiving unit Rx and a transmitting unit Tx, which are used for receiving and transmitting the telegrams, respectively. Preferably, a telegram may be transmitted from the controller 301 of the automation system 300 to the subscribers 303, 305, 401 in that the first subscriber, which has a shortest distance to the controller 301, receives the corresponding telegram with its receiving unit Rx and transmits it to the respective next subscriber with its transmitting unit Tx.

The respective next subscriber receives the telegram from the respective preceding subscriber with its receiving unit Rx and sends the telegram with its sending unit Tx to the respective next subscriber. The last subscriber in turn receives the telegram from the previous subscriber and sends the telegram back to the controller 301.

Thus, a telegram may pass through all subscribers 303, 305, 401 of the automation system 300 before being sent back to the controller 301.

Each of the subscribers 303, 305, 401 may, upon receipt of the telegram by its connecting unit 503, extract the query message or function instruction addressed to the respective subscriber from the received telegram, perform the corresponding function or insert a corresponding response message into the telegram and transmit it to the respective next subscriber with the transmitting unit Tx.

After all subscribers have received the telegram and have executed the respective function instruction directed to them or have responded to the query message directed to them with a corresponding response message and have integrated this response message into the telegram, the last subscriber may send the processed telegram back to the controller 301.

Thus, the automation system 300 including the controller 301 and the subscribers 303, 305, 401 may execute the method 100 for modifying a control software of an automation system 300 by sending out telegrams by the controller 301 to the subscribers 303, 305, 401 as described above, in that the controller incorporates the query messages according to the first query step 101 and the second query step 203 into corresponding telegrams, transmits them to the subscribers 303, 305, 401, and the subscribers 303, 305, 401 respectively addressed by the query messages incorporate the corresponding response messages into the respective telegram according to the first response step 103 and the second response step 205. The response messages of the subscribers that include them in the telegram may in the present case also comprise measurement data of a corresponding device of the respective subscriber 305, 401.

Figure 5:
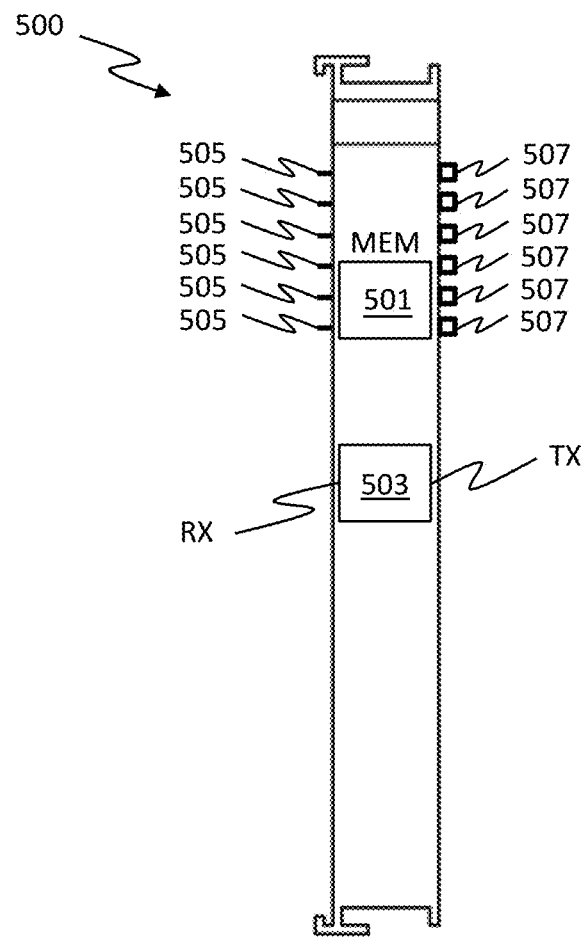
FIG. 5 is a schematic diagram of a software terminal according to one embodiment.

FIG. 5 shows a schematic diagram of a software terminal 500 according to another embodiment.

In FIG. 5, the software subscriber 303 of the automation system 300, which is used as described above in the method 100 for modifying a control software of an automation system 300 or in the automation system 300 described above for modifying the control software of the automation system 300, is embodied as a software terminal 500, in particular as a bus terminal.

The software terminal 500 comprises a memory unit 501 and a connecting unit 503. The memory unit 501 is used to store modification instructions for modifying the control software of the automation system 300. The memory unit 501 may be configured to store a plurality of modification instructions.

Moreover, the memory unit 501 may be configured to be capable of being overwritten multiple times, so that multiple different modification instructions may be sequentially stored on the memory unit 501. Thus, the software terminal 500 may be used for various changes to the control software of an automation system 300.

The connecting unit 503 is used to provide communication with a controller 301 or other subscribers 305, 401 of an automation system 300. The connecting unit 503 may have a receiving unit Rx and a transmitting unit Tx and thus enable the receipt and transmission of telegrams.

In addition, the connecting unit 503 may be embodied to read out received query messages from the controller 301, e.g. incorporated into corresponding telegrams, and to transmit corresponding response messages or incorporate them into respective telegrams.

Communication of the software terminal 500 with other subscribers or terminals of the automation system 300 may also be implemented via first connections 505 and second connections 507, by which the software terminal 500 may be connected to corresponding bus lines of the data bus 307 and corresponding connections of further bus terminals, respectively.

The software terminal 500 may be embodied as a commercially available bus terminal, e.g. as an EtherCAT terminal, so that the software terminal 500 may be integrated into a data bus 307 of an automation system 300 and may also be connected to further bus terminals of the automation system and e.g. be combined to form a terminal system.

The software terminal 500 may further comprise a latching unit by which the software terminal 500 may be latched over a corresponding mounting rail and may be connected to further subscriber terminals to form a terminal system as shown in FIG. 7.

Figure 6:
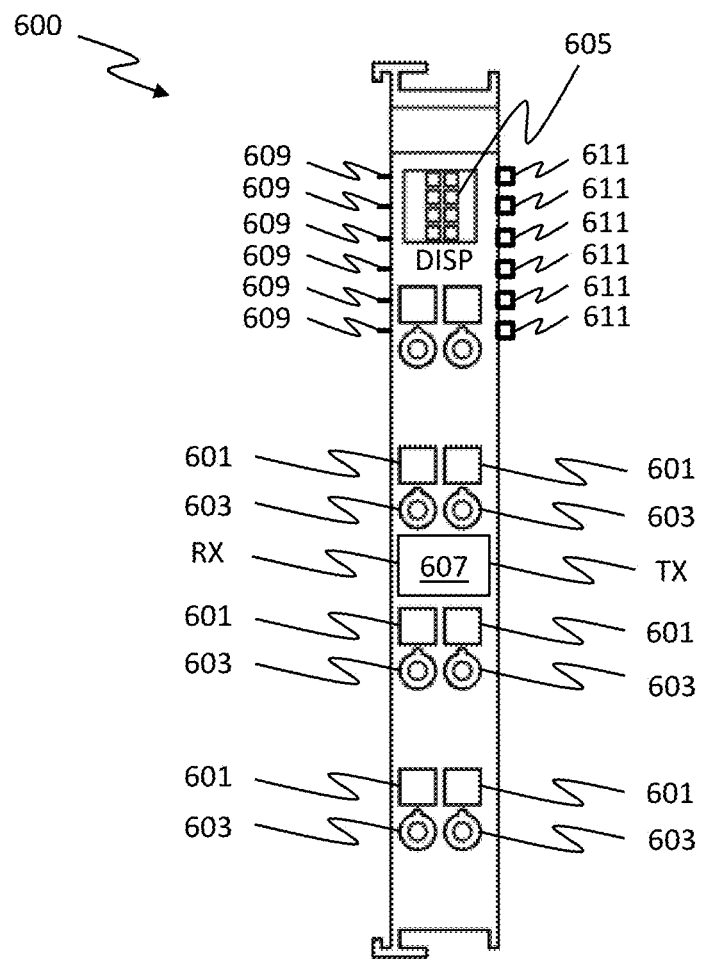
FIG. 6 is a schematic depiction of a further subscriber terminal according to an embodiment.

FIG. 6 shows a schematic diagram of another subscriber terminal 600 according to another embodiment.

The subscribers 305, 401 of the automation system 300 that are not a software subscriber 303 may each comprise a subscriber terminal 600. The subscriber terminal 600 may be structurally substantially analogous to the software terminal 500. In contrast to the software terminal 500, however, the further subscriber terminals 600 of the subscribers 305, 401 are embodied as I/O terminals (input/output terminals) and additionally each comprise connection devices 601 with a plurality of connection openings 603 for connecting devices of the automation system 300. Such devices of the subscribers 305, 401 may e.g. be actuators, sensors, motors or further devices for an automation system.

The subscriber terminal 600 further has a second connecting unit 607 by which the subscriber terminal 600 may communicate with the controller 301 or other subscribers of the automation system 300 via a data transmission. The second connecting unit 607 comprises a receiving unit Rx and a transmitting unit Tx for receiving and transmitting bus protocols, e.g. telegrams.

The second connecting unit 607 is thus capable of receiving telegrams transmitted by the controller 301, to read them out, to drive the corresponding device connected to the respective subscriber terminal 600 with the respective message of the received telegram and, if necessary, to insert measurement data or further parameters of the respective device as a response message into the corresponding telegram and to transmit this to the respective next subscriber or to the controller 301 of the automation system 300.

The subscriber terminal 600 further comprises third terminals 609 and fourth terminals 611, by which the subscriber terminal 600 may be connected to corresponding bus lines of a data bus 307. Via the third connections 609 and the fourth connections 611, the subscriber terminal 600 may further be connected to further terminals, e.g. to a software terminal 500, and may be combined to form a terminal system.

The subscriber terminal 600 further comprises a latching unit by which the subscriber terminal 600 may be latched to a mounting rail and thus assembled with further terminals to form a terminal system as shown in FIG. 7.

The subscriber terminal 600 further comprises a display device 605 by which an operating state of the subscriber terminal 600 or of the device connected to the subscriber terminal 600 may be indicated.

The embodiment of the software terminal 500 and the subscriber terminal 600 shown in FIG. 5 and FIG. 6 serves only as an exemplary embodiment and is not to be construed as limiting.

FIG. 7 shows a schematic diagram of a terminal system 700 having a software terminal 500 and a plurality of subscriber terminals 600 according to an embodiment.

The terminal system 700 in FIG. 7 comprises a software terminal 500 and six subscriber terminals 600, which are joined on a mounting rail 703 to form the terminal system 700. The terminal system 700 further comprises a bus coupler 701, which is also attached to the mounting rail 703.

The subscriber terminals 600 are embodied as I/O terminals and comprise a plurality of connection devices 601 with corresponding connection openings 603. For reasons of clarity, not all features of the subscriber terminals 600 are shown here.

The software terminal 500 has a memory unit 501 and a connecting unit 503, which comprise a receiving unit Rx and a transmitting unit Tx.

The bus coupler 701 is embodied at a front end of the terminal system 700 and is used to provide a connection of the terminal system 700 to a data bus 307 of an automation system 300.

The software terminal 500 and the other subscriber terminals 600 are connected to one another by the first terminals 505, the second terminals 507, the third terminals 609 and the fourth terminals 611, each of which is not shown in FIG. 7. Data transmission or data communication of the individual terminals 500 and 600 of the terminal system 700 may be implemented via an internal data bus, for example a K-bus (communication bus). The internal data bus (K-bus) may differ from the data bus 307 of the automation system 300, which may be implemented via a field-bus system, with respect to the signal transmission and, if applicable, the transmitted bus protocols.

Here, the bus coupler 701 serves to convert the signals transmitted by the data bus 307 into signals of the internal data bus (K bus) and thus to realize a data communication between the software terminal 500 and the further subscriber terminals 600 within the terminal system 700 via the internal data bus (K bus). Moreover, the bus coupler 701 may convert a conversion of the bus protocols transmitted via the data bus 307, e.g. the telegrams of the EtherCAT rock bus protocol, into bus protocols corresponding to a data transmission of the internal data bus (K bus).

The bus coupler 701 may receive bus protocols, e.g. telegrams, via an external interface 705, convert them into corresponding bus protocols that correspond to a data transmission via the internal bus (K-bus), and forward the converted bus protocols to the software terminal 500.

The software terminal 500 receives, with the receiving unit Rx, the bus protocols forwarded by the bus coupler 701, responds to the corresponding query messages addressed to it, and sends the revised bus protocols to the subsequent further subscriber terminals 600 with the sending unit Tx via the internal data bus (K bus).

These in turn receive the forwarded bus protocols with the respective receiving units Rx, process the corresponding query messages or function instructions, respectively, and send the processed bus protocols to the respective subsequent further subscriber terminals 600 via the corresponding transmitting units Tx.

The query messages in the form of bus protocols, for example telegrams, sent out by the controller 301 of an automation system 300 may thus be received by the bus coupler 701 of the terminal system 700, modified accordingly for transmission via the internal data bus (K-bus) of the terminal system 700 and forwarded to the terminals of the terminal system 700, which respond to or execute the corresponding query messages or functional instructions and insert the corresponding response messages or results, such as measurement data, into the respective bus protocol, so that the bus protocol runs through all terminals of the terminal system 700 before it is sent back to the controller 301.

Figure 8:
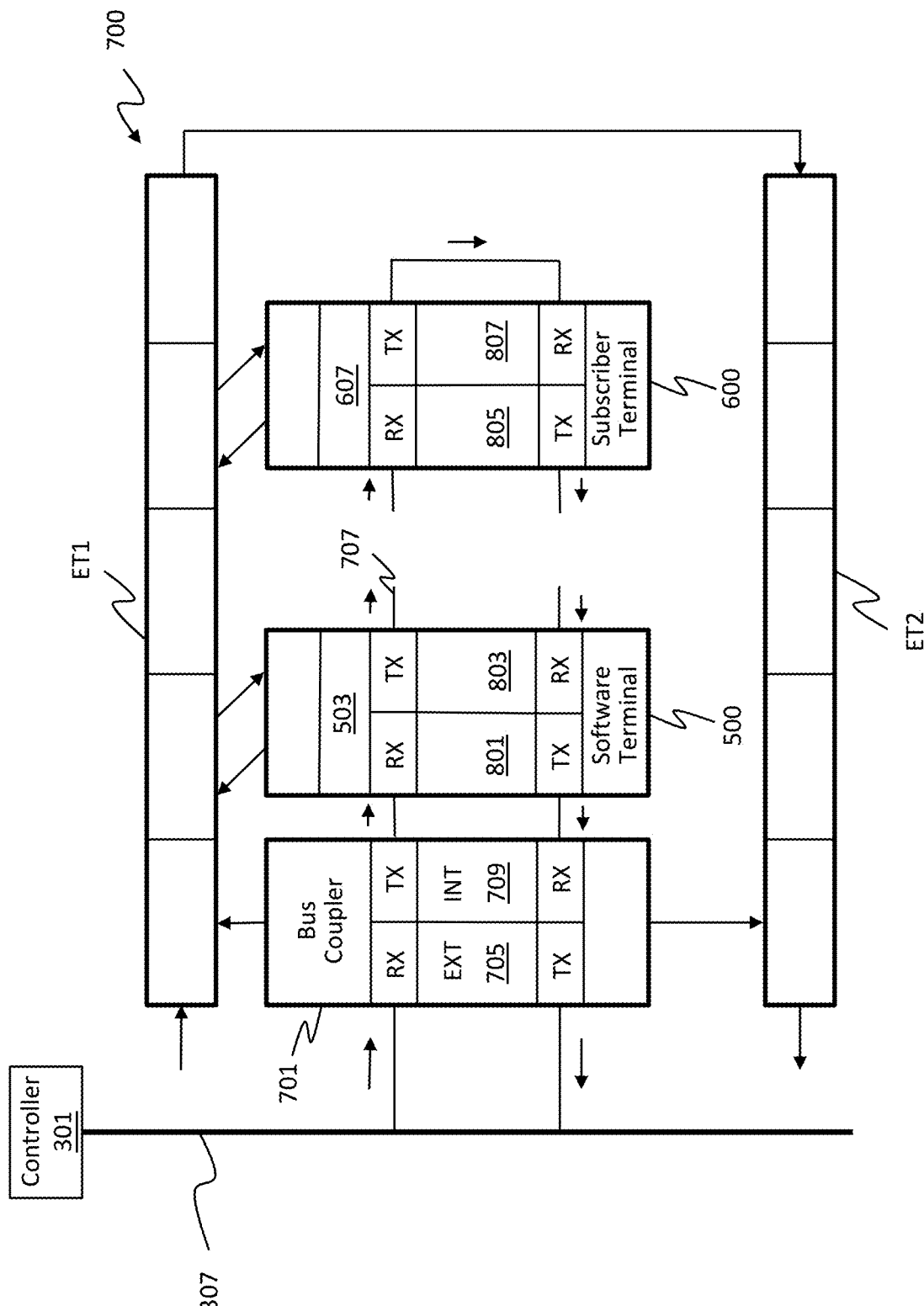
FIG. 8 is a schematic depiction of an automation system in which the terminal system in FIG. 7 is connected to a controller of the automation system via a data bus, according to a embodiment.

FIG. 8 shows a schematic diagram of a data communication of the terminal system 700 with a controller 301 of an automation system 300 via a data bus 307.

FIG. 8 schematically illustrates the data transmission within the terminal system 700 described in FIG. 7. The terminal system 700 comprises a bus coupler 701, a software terminal 500 and a subscriber terminal 600. For illustrative reasons, no further subscriber terminals are shown.

The bus coupler 701 comprises an external interface 705, by which the bus coupler 701 is connected to the data bus 307 of the automation system 300. Furthermore, the bus coupler 701 comprises an internal interface 709 via which the bus coupler 701 is connected to the software terminal 500 and the further terminals 600.

The bus coupler 701, the software terminal 500 and the other subscriber terminals 600 are interconnected via an internal data bus 707.

The external interface 705 of the bus coupler 701 comprises a receiving unit Rx and a transmitting unit Tx. The internal interface 709 of the bus coupler 701 also has a receiving unit Rx and a transmitting unit Tx. The software terminal 500 also has two receiving units Rx and two transmitting units Tx, each of which jointly forms a pair of a first transmission device 801 and a second transmission device 803. The subscriber terminal 600 again comprises two receiving units Rx and two transmitting units Tx, each of which jointly forms a pair of a third transmission device 805 and a fourth transmission device 807.

The receiving unit Rx of the external interface 705 and the transmitting unit Tx of the internal interface 709 of the bus coupler 701, the receiving unit Rx of the first transmission device 801 and the transmitting unit Tx of the second transmission device 803 of the software terminal 500, and the receiving unit Rx of the third transmission device 805 and the transmitting unit Tx of the fourth transmission device 807 of the further subscriber terminal 600 form a forward direction of the internal data bus 707, which is indicated by the arrows pointing from left to right.

The receiving unit Rx of the fourth transmission device 807 and the transmitting unit Tx of the third transmission device 805 of the further subscriber terminal 600, the receiving unit Rx of the second transmission device 803 and the transmitting unit Tx of the first transmission device 801 of the software terminal 500, and the receiving unit Rx of the internal interface 709 and the transmitting unit Tx of the external interface 705 of the bus coupler 701 form a return direction of the internal data bus 707, which is indicated by the arrows pointing from right to left.

The bus coupler 701 receives a bus protocol, e.g. a telegram, via the data bus 307 with the receiving unit Rx of the external interface 705. After appropriate adaptation of the received bus protocol and adaptation to the internal data bus 707, the bus coupler 701 transmits the bus protocol as a bus protocol of the internal data bus 707, characterized in the present case as first protocol ET1, with the transmitting unit Tx of the internal interface 709 to the receiving unit Rx of the first transmission device 801 of the software terminal 500.

The first protocol ET1 may e.g. be a telegram of a field-bus system.

The software terminal 500 reads the received first protocol ET1 with the connecting unit 503 and inserts the modification instruction into the first protocol ET1 at the corresponding position provided for the software terminal 500. Subsequently, the software terminal 500 sends the edited first protocol ET1 to the subscriber terminal 600 via the transmission unit Tx of the second transmission device 803 through the internal data bus 707.

The subscriber terminal 600 receives the first protocol ET1 via the receiving unit Rx of the third transmission device 805, reads the first protocol ET1 with the second connecting unit 607, and inserts the requested data, such as measurement data of a device of the automation system 300 connected to the subscriber terminal 600, into the corresponding location in the first protocol ET1, and transmits the first protocol ET1 to a subscriber terminal 600 with the transmitting unit Tx of the fourth transmission device 807.

The last subscriber terminal 600 of the terminal system 700 transmits the first protocol ET1 via the transmission unit Tx of the third transmission device 805 on the return direction of the internal data bus 707 to the upstream further subscriber terminals 600 or to the upstream software terminal 500.

The reading of the first protocol ET1 or the insertion of the modification instruction by the software terminal 500 is indicated by the arrows pointing from the software terminal 500 to the first protocol ET1 and from the first protocol ET1 to the software terminal 500.

The reading of the first protocol ET1 and the insertion of measurement data by the subscriber terminal 600 is indicated by the arrows pointing from the further subscriber terminal 600 to the first protocol ET1 and from the first protocol ET1 to the further subscriber terminal 600.

For simplified illustration, the first protocol ET1 sent back on the return direction of the internal data bus 707 from the last further subscriber terminal 600 in the direction of the bus coupler 701 is shown here as a second protocol ET2.

The second protocol ET2 again passes through the other terminals 600 and the software terminal 500 of the terminal system 700, but no further processing of the second protocol ET2 by the terminals of the terminal system 700 takes place.

The bus coupler 701 receives the second protocol ET2 with the receiving unit Rx of the internal interface 709 and converts the second protocol ET2 into a bus protocol of the data bus 307, and transmits the converted second protocol ET2 to the controller 301 via the transmitting unit Tx of the external interface 705 through the data bus 307.

The data transmission of a bus protocol, e.g. a telegram, from a data bus 307 of an automation system 300 in a terminal system 700 with bus coupler 701, at least one software terminal 500 and at least one further subscriber terminal 600 shown here is for illustrative purposes only.

An actual data transmission via a data bus 307 of an automation system 300 in a terminal system 700 may differ from the schematic sequence shown here and may have additional features, or features shown in FIG. 8 may be omitted.

For example, the first protocol ET1 may be forwarded to a further terminal system not shown in FIG. 8 instead of to bus coupler 701. Only from this further terminal system, after complete processing of the first protocol ET1, may this in turn be sent back to the controller as the second protocol ET2 in the return direction and via the terminal system 700 of FIG. 8.

Further modifications of the data transmission are also conceivable.

Figure 9:
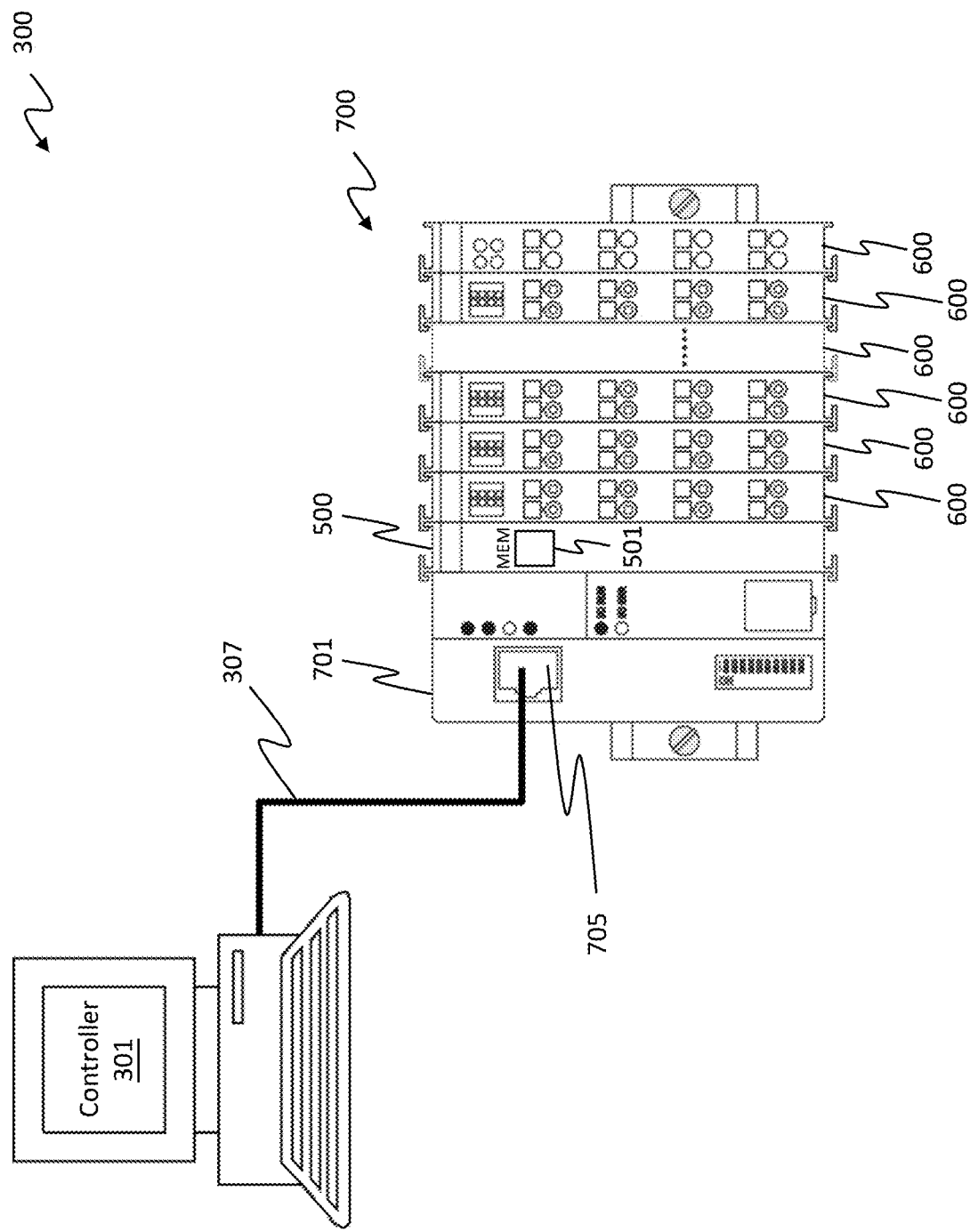
FIG. 9 is a schematic diagram of an automation system in which the terminal system in FIG. 7 is connected to a controller of the automation system 300 via a data bus, according to a further embodiment.

FIG. 9 shows a schematic depiction of an automation system 300, in which the terminal system 700 in FIG. 7 is connected to a controller 301 of the automation system 300 via a data bus 307 according to an embodiment.

The controller 301 is shown in FIG. 9 as a control PC. Alternatively, the controller 301 may be an integrated controller, a server-based controller or a network-based controller.

Furthermore, the terminal system 700 may comprise additional subscriber terminals 600 and additional software terminals 500, respectively. Further, the automation system 300 may comprise multiple terminal systems 700.

The software terminal 500 may have the following functions:

1. Identifying a further subscriber terminal 600 and a device connected to the further subscriber terminal 600. Via storing a control software on the software terminal 500, specific operating parameters, individual identification characteristics, and other information relating to the device connected to the subscriber terminal 600 within the modification instruction of the software terminal 500, the software terminal 500, when carrying out the method 100 described above for modifying a control software of an automation system 300, may identify a device newly inserted into the automation system 300, connected to the subscriber terminal 600, so that the controller 301 of the automation system may individually address and control the newly inserted device in the automation system 300 after the control software is modified accordingly.

2. Moreover, the modification instruction may be stored on the memory unit 501 of the software terminal 500. For the actual operation or execution of the modification instruction, the modification instruction is installed in the controller 301 of the automation system 300 and executed by the controller 301. A stand-alone controller for executing the modification instruction or for executing the control software stored in the modification instruction of a new device inserted into the automation system 300, is not necessary. Applications requiring high processing power may thus be transferred to the main computer of the controller 301 of the automation system 300.

3. Furthermore, control software of the new device added to the automation system 300 may be provided by appropriate licensing stored on the memory unit 501 of the software terminal 500 within the framework of the modification instruction. This may assure that only licensed software may be used to control 301 the additional device. In this way, quality and safety standards of the automation system 300 may be maintained.

4. In a terminal system 700 as described above, the software terminal 500 may serve for addressing by the controller 301 of the additional subscriber terminals 600 arranged in the terminal system 700 downstream of the software terminal 500, each comprising devices newly inserted into the automation system 300. When the software terminal 500 and the additional devices newly inserted into the automation system 300 via the further subscriber terminals 600 are identified by the controller 301, the controller may address the addressing of the additional devices via the arrangement of the respective further subscriber terminals 600 relative to the software terminal 500 by having the software terminal 500 serve as an addressing zero point with respect to the additional devices arranged by the further subscriber terminals 600 behind the software terminal 500. Addressing of the additional devices may then be performed e.g. by counting the locations within the terminal system 700 relative to the software terminal 500 at which the further subscriber terminals 600 belonging to the additional devices are arranged in the terminal system 700. Thus, additional addressing is not necessary.

This invention has been described with respect to exemplary embodiments. It is understood that changes can be made and equivalents can be substituted to adapt these disclosures to different materials and situations, while remaining with the scope of the invention. The invention is

TABLE 1

List of Reference Symbols

| | |
|---|---|
| 100 | method for modifying a control software of an automation system |
| 101 | first query step |
| 103 | first response step |
| 105 | verification step |
| 107 | modification step |
| 109 | discard step |
| 111 | error message step |
| 201 | installation step |
| 203 | second query step |
| 205 | second response step |
| 207 | identification step |
| 300 | automation system |
| 301 | controller |
| 303 | software subscribers |
| 305 | subscribers |
| 307 | data bus |
| 401 | additional subscriber |
| 500 | software terminal |
| 501 | memory unit |
| 503 | connecting unit |
| 505 | first connection |
| 507 | second connection |
| 600 | subscriber terminal |
| 601 | connection device |
| 603 | connection opening |
| 605 | display device |
| 607 | second connecting unit |
| 609 | third connection |
| 611 | fourth connection |
| 700 | terminal system |
| 701 | bus coupler |
| 703 | support rail |
| 705 | external interface |
| 707 | internal data bus |
| 709 | internal interface |
| 801 | first transmission device |
| 803 | second transmission device |
| 805 | third transmission device |
| 807 | fourth transmission device |
| ET1 | first protocol |
| ET2 | second protocol |
| Rx | receiving unit |
| Tx | transmitting unit |

The invention claimed is:

1. A method for modifying a control software of an automation system comprising a controller and a plurality of subscribers,
wherein the subscribers are connected to the controller via a data bus and communicate via a data exchange,
wherein the data bus is configured as a field bus, wherein at least one of the subscribers is a software subscriber for modifying a control software of the controller,
wherein data communication is realized by sending and receiving data between the controller and the subscribers, or between the subscribers,
wherein sending and receiving of data by the subscribers is performed via a data telegram in which each respective subscriber reads first data from the data telegram and inserts second data into the data telegram, wherein the subscribers each have a receiving unit and a transmitting unit configured for receiving and transmitting the data telegram;
wherein the software subscriber is configured as a software terminal,
wherein the subscribers are configured as subscriber terminals,
wherein the software terminal and the subscriber terminals are further configured as bus terminals,
wherein the subscriber terminals and the software terminal are connected to one another via an internal bus line, and wherein the subscriber terminals and the software terminal are each latched over a corresponding mounting rail and form a terminal system, and
wherein the software subscriber comprises a memory unit on which at least one modification instruction for modifying the control software is stored, wherein the at least one modification instruction comprises a part of the control software to be modified and/or an additional part of the control software;
the method comprising:
sending an individual query message by the controller to the software subscriber to query the at least one modification instruction to modify the control software in a first query step;
sending a response message by the software subscriber to the controller for providing the at least one modification instruction to modify the control software in a first response step;
verifying the at least one modification instruction for modifying the control software by the controller as to whether the modification instruction is compatible with the control software in a verification step;
modifying the control software in accordance with the modification instruction and implementing the modification of the modification instruction in the existing control software by the controller in a modification step if the modification instruction is compatible with the control software; and
discarding of the modification instruction by the controller in a discard step if the modification instruction is incompatible with the control software, wherein modifying the control software according to the modification step comprises including at least one additional subscriber to the plurality of subscribers that is not the software subscriber in the data bus of the automation system, wherein the software terminal serves as an addressing zero point with respect to an additional device associated with the additional subscriber terminal positioned behind the software subscriber in the terminal system, and wherein the controller addresses the additional device associated with the additional subscriber terminal by counting positions in the terminal system between the position of the software terminal and the position of the additional subscriber terminal in the terminal system.

2. The method according to claim 1, further comprising:
installing the software subscriber in the data bus and connecting the software subscriber to the controller in an installation step;
sending an identification query by the controller to the subscribers to identify the subscribers located on the data bus in a second query step;
sending an identification response by the software subscriber to the controller in a second response step; and
identifying the software subscriber as a subscriber of the plurality of subscribers intended for modification of the control software by the controller based on the identification response in an identification step.

3. The method according to claim 1, wherein the discarding step comprises outputting an error message by the controller in an error message step.

4. The method according to claim 1, wherein the method is carried out:

in a start-up phase of the automation system, in which the automation system is not in operation, or in a running operation of the automation system, by carrying out a power-up of the control software in a start phase and by the controller recognizing the software subscriber as an additional subscriber, or by inserting the software subscriber in an area of the automation system which is in a configuration state, and by the controller recognizing the software subscriber as an additional subscriber.

5. The method according to claim 1, wherein the modification instruction comprises an update or a modification of the control software.

6. The method according to claim 1, wherein the at least one additional subscriber to the plurality of subscribers is connected to the software subscriber via a data bus line, wherein a communication bus of a terminal system is defined via the data bus line.

7. The method according to claim 1, wherein the modification instruction comprises an identification, control software, specific operating parameters or licensing of the control software of at least one of the subscribers.

8. A software terminal for modifying a control software of an automation system having a controller and a plurality of subscribers connected to the controller via a data bus,
wherein the data bus is configured as a field bus,
wherein the software terminal is integrated into the automation system as a subscriber and is configured as a bus terminal for use in the data bus, wherein the software terminal is latched over a corresponding mounting rail of a terminal system of the automation system,
wherein the software terminal comprises at least one memory unit on which at least one modification instruction for modifying the control software of the controller of the automation system is stored,
wherein the software terminal has a connecting unit which is configured to communicate with the controller and/or other subscribers of the automation system by exchanging data via the data bus and to provide the controller of the automation system with at least one modification instruction stored on the memory unit for modifying the control software of the controller, wherein the at least one modification instruction comprises a part of the control software to be modified and/or an additional part of the control software;
wherein data communication is realized by sending and receiving data between the controller and a software subscriber,
wherein sending and receiving of data by the software subscriber is performed via a data telegram in which the software subscriber reads first data from the data telegram and inserts second data into the data telegram, wherein the software subscriber has a receiving unit and a transmitting unit configured for receiving and transmitting the data telegram, wherein the software terminal is configured to serve as an addressing zero point with respect to an additional device associated with the additional subscriber terminal positioned behind the software subscriber in the terminal system.

9. A terminal system for use in an automation system, comprising a plurality of subscriber terminals with at least one software terminal according to claim 8,
wherein the plurality of subscriber terminals and the at least one software terminal are configured as bus terminals and are connected to one another via an internal bus line, and wherein each of the plurality of subscriber terminals is latched over a mounting rail of the terminal system; and
a bus coupler, wherein the bus coupler is configured to connect the terminal system to a data bus of the automation system.

10. An automation system comprising a controller, a plurality of subscribers which are connected to the controller via a data bus and are set up to communicate with the controller via the exchange of data, wherein the data bus is configured as a field bus, wherein the controller uses control software to address the plurality of subscribers, at least one subscriber of the plurality of subscribers being a software subscriber according to claim 8,
wherein the controller is configured to send an individual query message to the software subscriber for querying the at least one modification instruction for modifying the control software;
wherein the software subscriber is configured to send the at least one modification instruction to the controller to modify the control software;
wherein the controller is configured to verify the at least one modification instruction for modifying the control software to determine as to whether the modification instruction is compatible with the control software;
wherein the controller is configured to modify the control software in accordance with the modification instruction and to implement the modification of the modification instruction in the existing control software, if the modification instruction is compatible with the control software; and
wherein the controller is configured to reject the modification instruction if the modification instruction is incompatible with the control software, wherein the controller is configured to add at least one additional subscriber to the automation system by modifying the control software based on the at least one modification instruction, wherein the software terminal is configured to serve as an addressing zero point with respect to an additional device associated with the additional subscriber terminal positioned behind the software subscriber in the terminal system, and wherein the controller is configured to address the additional device associated with the additional subscriber terminal by counting positions in the terminal system between the position of the software terminal and the position of the additional subscriber terminal in the terminal system.

11. The automation system according to claim 10, wherein the controller and the software subscriber are configured to perform a modification of the control software according to the at least one modification instruction during a startup phase of the automation system in which the automation system is not in operation or during a running operation of the automation system by carrying out a power-up of the control software in the start phase and by the controller recognizing the software subscriber as an additional subscriber, or by inserting the software subscriber in an area of the automation system which is in a configuration state, and by the controller recognizing the software subscriber as an additional subscriber.

12. The automation system according to claim 10, wherein the modification instruction comprises an update or a modification to the control software.

13. The automation system according to claim 10, wherein the modification instruction comprises an identification, a control software, specific operating parameters, or a licensing of the control software at least one of the subscribers.

\* \* \* \* \*